(12) United States Patent  (10) Patent No.: US 8,547,128 B1
Sochor                    (45) Date of Patent:    *Oct. 1, 2013

(54) CONTACT PROBE WITH CONDUCTIVELY COUPLED PLUNGERS

(71) Applicant: Jerzy Roman Sochor, Sunnyvale, CA (US)

(72) Inventor: Jerzy Roman Sochor, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/745,941

(22) Filed: Jan. 21, 2013

Related U.S. Application Data

(63) Continuation-in-part of application No. 13/465,014, filed on May 6, 2012, now Pat. No. 8,373,430.

(51) Int. Cl.
*G01R 31/00* (2006.01)

(52) U.S. Cl.
USPC ............ 324/755.05; 324/750.25; 324/750.27; 324/754.05; 324/754.11; 324/754.14; 439/66

(58) Field of Classification Search
USPC ............ 324/755.05, 750.25, 750.27, 754.05, 324/754.07, 754.11, 754.14, 755.07, 754.01; 439/66

See application file for complete search history.

(56) References Cited

U.S. PATENT DOCUMENTS

| | | | |
|---|---|---|---|
| 8,373,430 B1 * | 2/2013 | Sochor | 324/755.05 |
| 8,408,946 B1 * | 4/2013 | Sochor | 439/700 |

* cited by examiner

*Primary Examiner* — Arleen M Vazquez
*Assistant Examiner* — Son Le

(57) ABSTRACT

A contact probe comprises conductively coupled plungers and a coil spring. The plungers have coupling means which enable them to be slidably and non-rotatably engaged. The spring is attached to the plungers in a manner that prevents rotation of the spring's ends. A desired magnitude of torsional bias is generated by twisting the spring a predetermined angle prior to attachment of the spring to the plungers. An additional torsional bias is generated by the tendency of the spring to twist when the spring is axially displaced. The resultant torsional bias rotatably biases the coupling means of the plungers against each other, generating contact forces for a direct conductive coupling between the plungers. The plungers are self-latching or are retentively attached to the spring using the torsional bias of the spring. Plungers with hermaphroditic coupling means can be fabricated from a sheet metal or a profiled stock by stamping or machining.

36 Claims, 22 Drawing Sheets

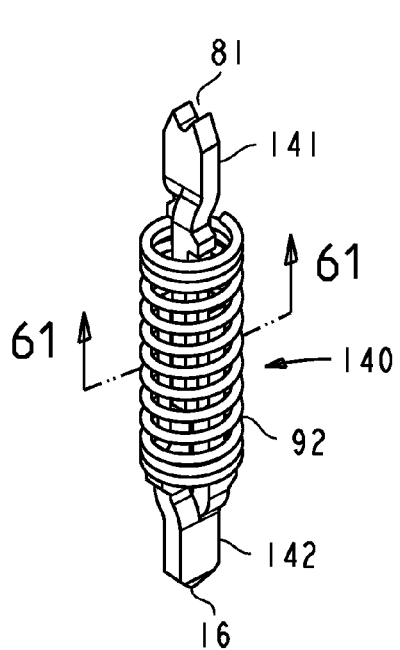
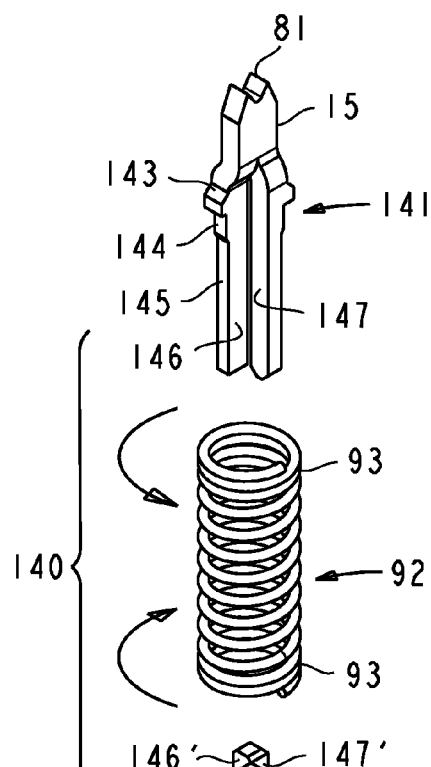
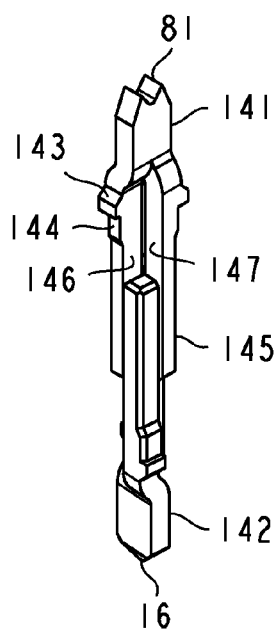
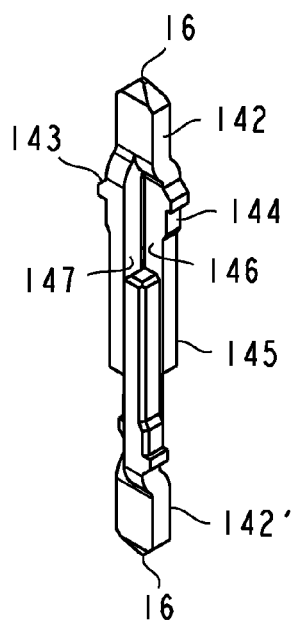
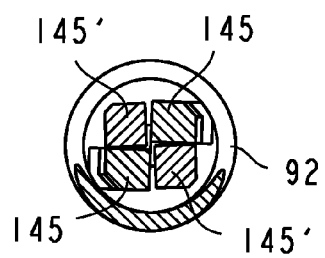
Fig. 58
Fig. 59
Fig. 60 A
Fig. 60 B
Fig. 61

CONTACT PROBE WITH CONDUCTIVELY COUPLED PLUNGERS

CROSS-REFERENCE TO RELATED APPLICATIONS

This is a continuation-in-part of application No. 13/465,014 filed May 6, 2012

BACKGROUND OF THE INVENTION

1. Technical Field

The present invention relates generally to electrical probes and contacts for interconnecting integrated circuit (IC) devices and electronic components and systems, and specifically, to miniature high speed circuit probes and contacts for separably interconnecting IC devices such as bare chips, IC packages, and electronic modules, to other devices, motherboards, test systems, and alike.

2. Background Art

Contact probes are typically used in interposer sockets which provide separable interfaces for two oppositely disposed devices having corresponding input/output (I/O) patterns. A typical application is an electrical socket for connecting an IC device to the next level of electronic hardware or to a test unit. The contact probes are positioned and maintained in a required array by an insulating housing which has contact receiving cavities, disposed in a pattern corresponding to the array of I/O terminals in each of the mated devices. The contact probes typically rely on a compression spring to provide a resilient compliance and contact force to axially displaceable contact members or plungers. The plungers have contact portions adapted for connecting to a particular I/O terminal such as a solder ball of a ball grid array (BGA) device or a contact pad of a land grid array (LGA) device.

A typical 4-piece contact probe consists of a hollow barrel, a compression coil spring, and two plungers. The spring and the body portions of the plungers are retained and guided in the barrel, which is crimped at both ends. In order to reduce the contact probe resistance and inductance, the contact probes typically rely on the plungers randomly tilting (i.e., deviating from axial alignment with the barrel) and electrically shorting to the barrel, so that most of the current could bypass the spring and flow through the barrel. This significantly lowers the overall contact resistance of the probe and the parasitic electrical effects of the coil spring. The plunger-to-barrel contact depends on the spring bias, fit tolerances of the plunger and the barrel, contact surface topography, and plating uniformity on the inside of the barrel. The diametrical clearance between the plungers and the barrel must be precisely controlled to prevent an excessive plunger tilt.

While very reliable and durable conventional 4-piece probes can be produced in larger sizes, the desired probe characteristics is difficult to achieve in miniature probes, e.g., probes having an outside diameter of less than 1.0 mm and the length of less than 5 mm. In view of the machining tolerances and plating thickness variation on the inside of the barrel and on the plunger, the diametrical fit between the plunger and the barrel is difficult to tightly control. Since the plunger bodies which are guided in the bore of the barrel tend to be short, even a small diametrical clearance between the plunger and the bore can cause an excessive tilt of the plunger. The excessive plunger tilt can lead to a high localized wear and increased friction which may cause seizing of the plunger in the barrel, preventing the return of the plunger to the original extension, and thus causing a premature contact failure. Plating of high aspect ratio and small diameter barrels also creates challenges due to the difficulty of circulating the plating solution in a small bore. In addition, the base surface of the bore is often irregular and difficult to clean thoroughly prior to plating. The surface defects and plating irregularities can significantly affect the sliding friction and cause non-linear or erratic contact forces. The short probes also tend to have stiffer springs and less compliance. This can lead to a large variation in contact forces and cause damage to the I/O terminals (e.g. deformation or shearing of BGA solder balls) when the contact forces are excessive.

Numerous contact probes have been proposed to address the above issues by eliminating the barrel. Many of these probes utilize the spring as a conductive member. However, a coil spring acts as an electrical inductor at high frequencies and therefore presents electrical performance problems. Some designs aim to limit the parasitic effects of the spring by using springs with canted coils (closely wound coils which are at an oblique angle to the direction of compression) or by utilizing variable pitch springs with progressively closing (shorting) coils as the spring is being compressed. Other designs attempt to mitigate the adverse electrical effects of the spring by enabling a direct conductive contact between plungers. These 3-piece probes usually depend on a random biasing of the plungers against each other (e.g., due to spring load unbalance and plunger tilt). A direct resilient engagement between the plungers has also been proposed but it is particularly difficult to implement in miniature probes due to the difficulty of controlling the stiffness of the engagement means and the magnitude of the resilient engagement. A more effective direct plunger coupling mechanism, which overcomes these limitations is therefore highly desired.

The need for cost effective contact probes has also become more prominent in recent years. Of particular interest are 3-piece probes having stamped plungers, as illustrated by U.S. Pat. Nos. 8,033,872 B2 (2011) to Yang et al; 7,946,855 B2 (2011) to Osato; 7,862,391 B2 (2011) to Johnston et al; 7,841,864 B2 (2010) to Hsiao et al; 7,677,901 B1 (2010) to Suzuki et al; 7,256,593 B2 (2007) to Treibergs; 7,134,920 (2006) to Ju et al; and 7,025,602 B1 (2006) to Hwang. While stamping is prevalent in fabrication of electrical contacts and has the potential for providing cost effective high performance contact probes, stamped plungers also pose challenges and are particularly difficult to implement in small sizes, such as are required for mounting centers of about 1.0 mm. The challenges include effective utilization of space (fitting rectangular plunger sections inside the spring), maintaining coaxiality and pointing accuracy of the plungers (avoiding excessive tilt); avoiding sharp edge contact and parasitic friction between components, providing low and consistent contact forces when a direct resilient engagement between the plungers is employed, and providing an effective self-latching of the plungers to enable spring preload and one-piece contact probe handling. Consequently, there is a need for improved high performance contact probes which have cost effective stamped plungers, and which are suitable for use in test sockets and connectors having a close contact spacing, and a small connection height and thus low self-inductance.

SUMMARY

The present invention provides electrical contact probes and connectors for connecting oppositely disposed electronic devices and components having complementary arrays of I/O terminals. A representative contact probe comprises: (1) a first plunger adapted to make a separable conductive connection to a terminal of the first device; (2) a second plunger adapted to make a separable conductive connection to a corresponding terminal of the second device; and (3) a coil spring providing an axial plunger bias for conductive connection of the plungers to the respective I/O terminals, and a torsional bias for conductive coupling between the plungers.

The plungers have coupling means which enable them to be slidably and non-rotatably coupled to each other. The spring is attached to the plungers in a manner that prevents rotation of the spring's ends. The spring can be attached to the plungers with a predetermined angle of twist, which provides a permanent torsional bias for a direct conductive coupling between the plungers. Additional torsional bias is generated due to the tendency of the spring to unwind when the spring is compressed. The resultant total torsional bias rotatably biases the coupling means of the plungers against each other and thus provides contact forces for a direct conductive contact between the plungers. The conductive coupling between the plungers provides a short and direct conductive path through the plungers while substantially bypassing the typically inductive and resistive spring. The parasitic electrical effects of the spring are thus substantially reduced. The spring can be further coated with an insulating coating to render the spring electrically insignificant.

Plungers with hermaphroditic coupling means can be efficiently fabricated from a sheet metal or from a profiled stock by stamping. The profiled stock provides coupling surfaces precisely defined. Thus the coupling surface topography and the coupling fit tolerances can be precisely controlled. All coupling surfaces are external and can be easily electroplated. The close coupling fit assures that the plungers remain substantially coaxial during operation which reduces wear and improves the contact probe's pointing accuracy.

DRAWINGS

Figure 8A:
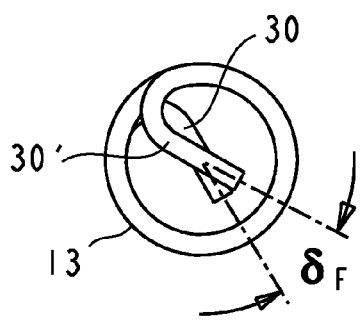
Figure 8B:
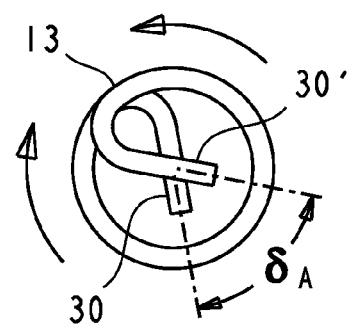

FIGS. 8A-B illustrate twist of the spring in contact probe assembly.

Figure 9:
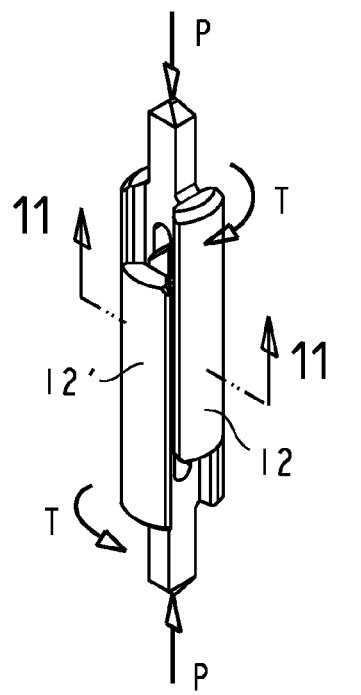
Figure 10:
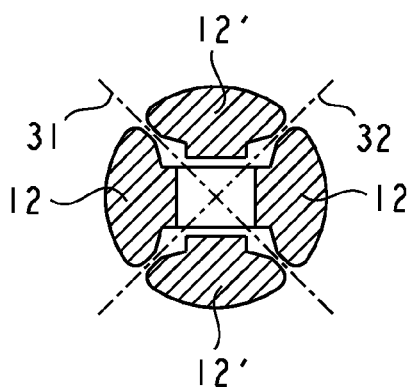
Figure 11:
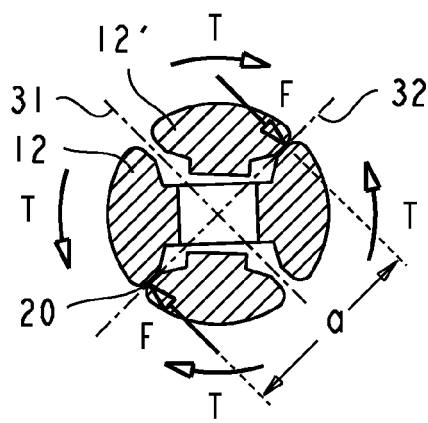

FIGS. 9-11 illustrate the torsional bias mechanics.

Figure 12:
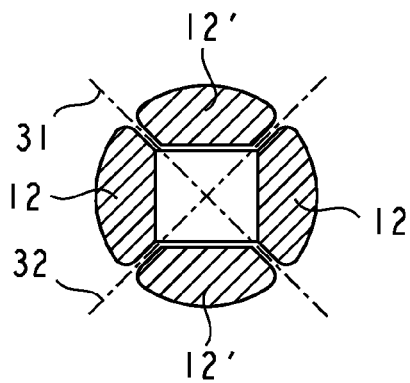
Figure 13:
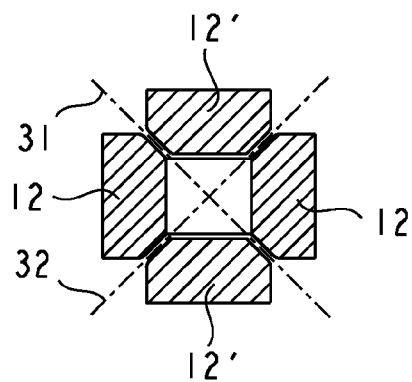

FIGS. 12-13 are cross-sectional views of additional coupling configurations.

Figure 14:
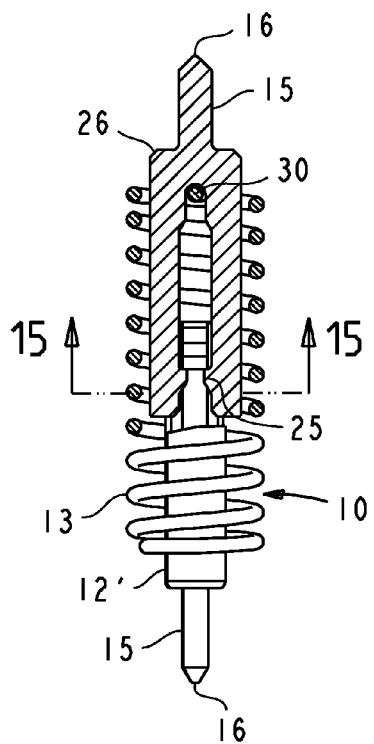

FIG. 14 is a partially cross-sectioned front view of the contact probe showing plunger latching.

Figure 15:
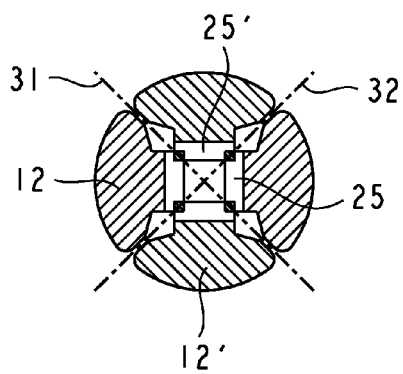

FIG. 15 is a cross-sectional view of engaged plungers taken as indicated by the lines 15-15 of FIG. 14, with the spring omitted.

Figure 16:
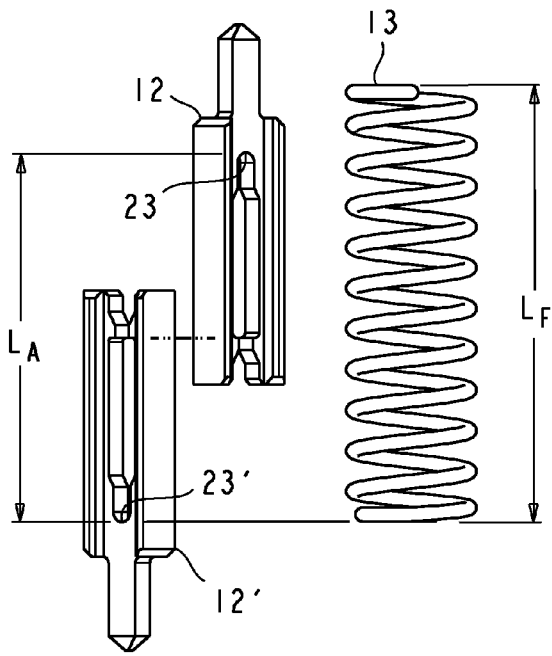

FIG. 16 shows the plungers and the spring side-by-side to illustrate spring preload.

Figure 17:
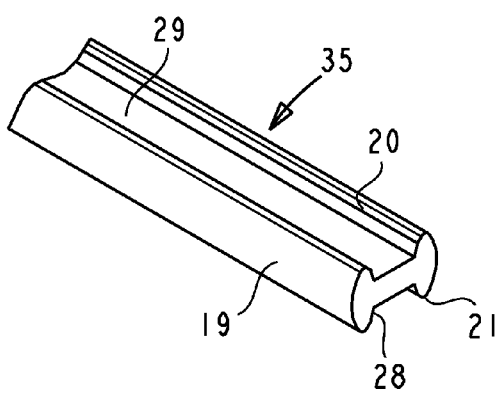

FIG. 17 shows a profiled stock which can be used for fabrication of plungers with hermaphroditic coupling means having canted coupling surfaces.

Figure 1:
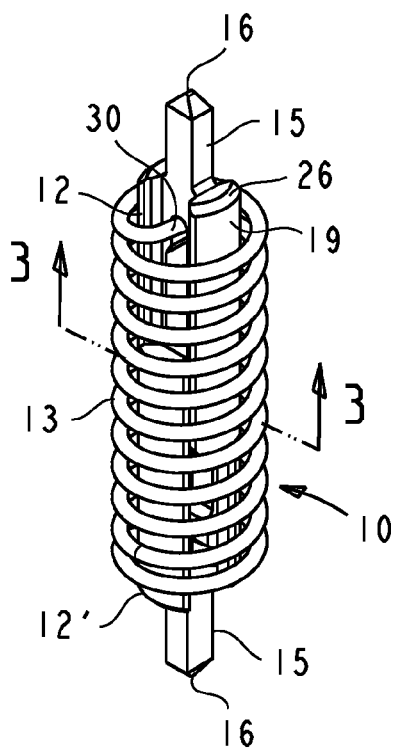
FIG. 1 is a perspective view of a contact probe comprising self-latching plungers with canted coupling surfaces.
Figure 18:
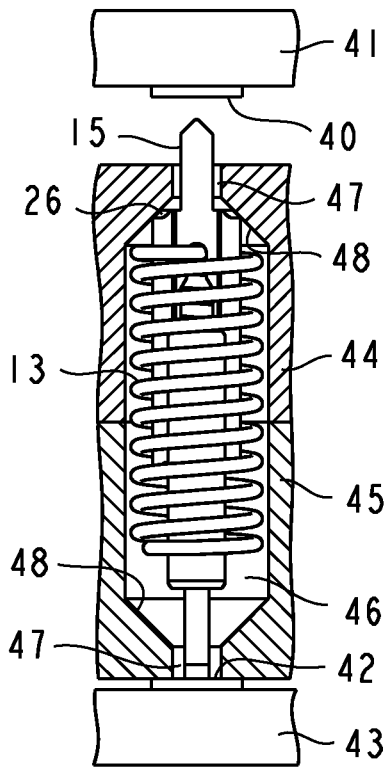
Figure 18:
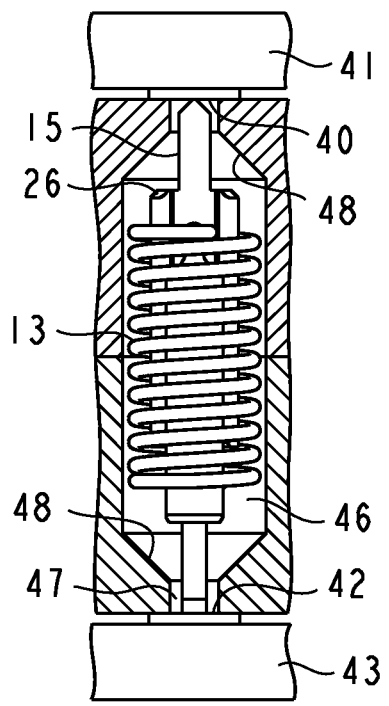

FIG. 18A is a cross-sectional detail of an interposer connector, showing the probe of FIG. 1 assembled in a cavity of an insulative housing and preloaded against an LGA terminal of the second device.

FIG. 18B is a cross-sectional detail of an interposer connector, showing the probe of FIG. 1 assembled in a cavity of an insulative housing and fully compressed between the terminal of the first device and a corresponding terminal of the second device.

FIGS. 19-22 show a contact probe having shoulder-less plungers with canted coupling surfaces.

Figure 23:
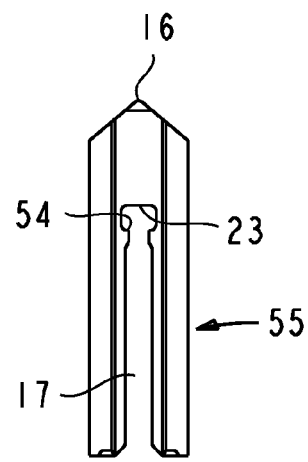

FIG. 23 is a front view of a plunger having ledges for retentively engaging an end filar of the spring.

Figure 24:
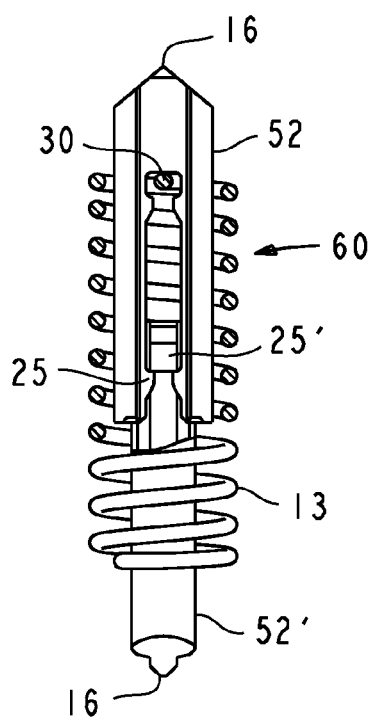

FIG. 24 shows a contact probe having both plungers adapted for connecting to a contact pad of an LGA device.

Figure 19:
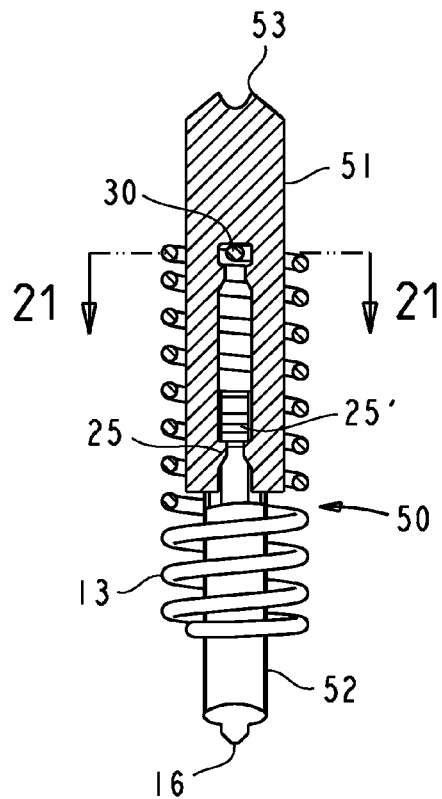
Figure 25:
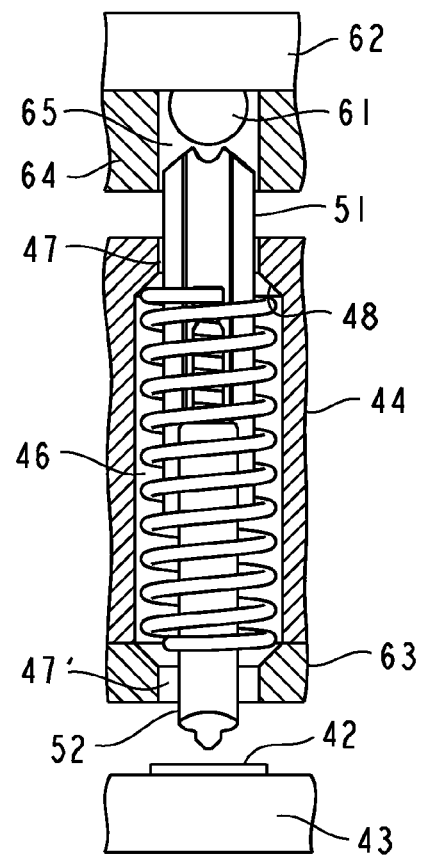

FIG. 25 is a cross-sectional detail of an interposer connector showing an insulator cavity detail for the contact probe of FIG. 19.

Figure 26:
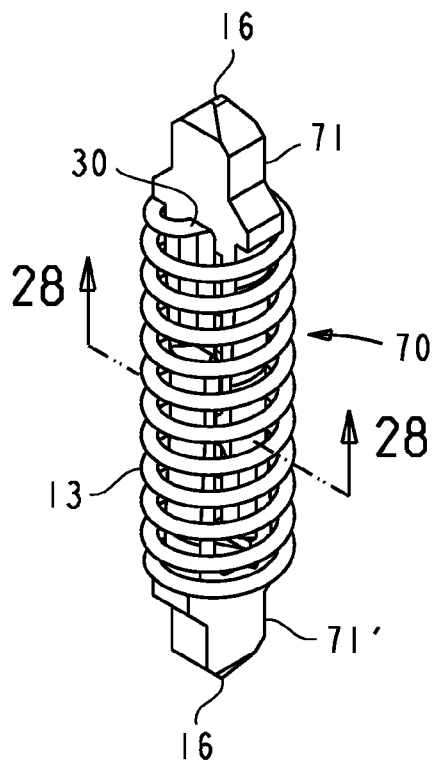

FIG. 26 is a perspective view of a contact probe having self-latching plungers with stepped canted coupling surfaces.

Figure 27:
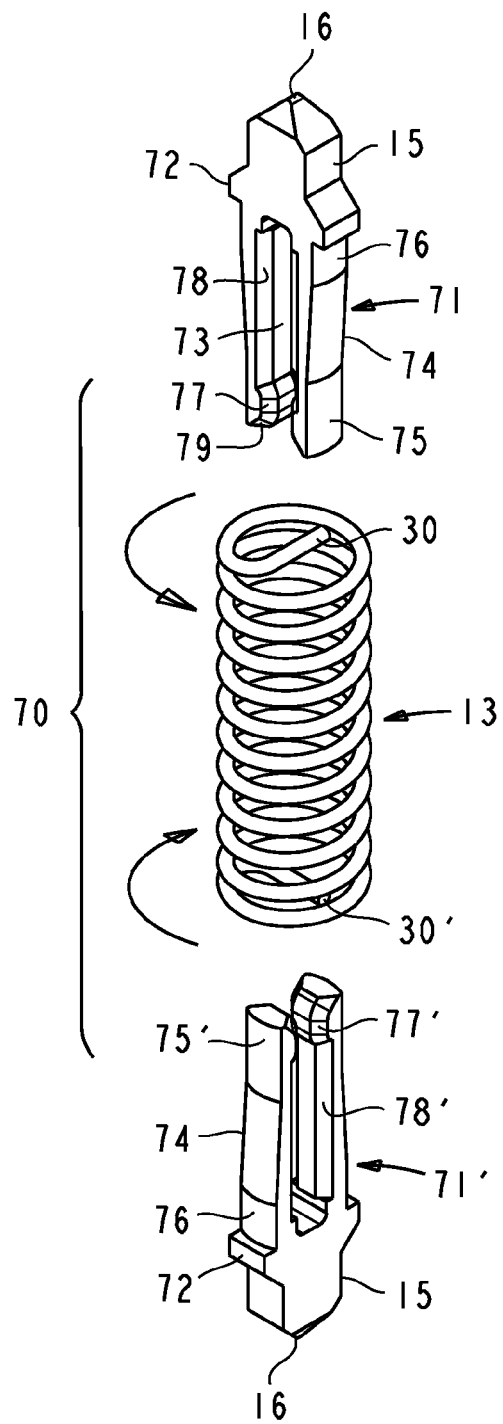

FIG. 27 is an exploded perspective view of the contact probe of FIG. 26.

Figure 28:
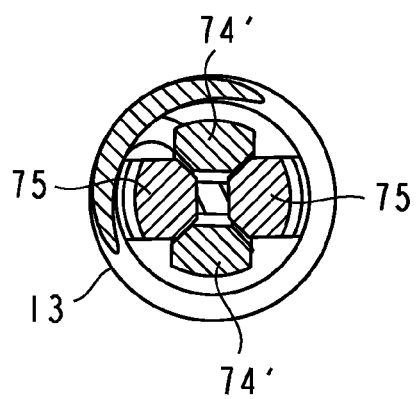

FIG. 28 is a cross-sectional view of the contact probe of FIG. 26, taken at the coupled surfaces, as indicated by the lines 28-28 of FIG. 26.

Figure 29:
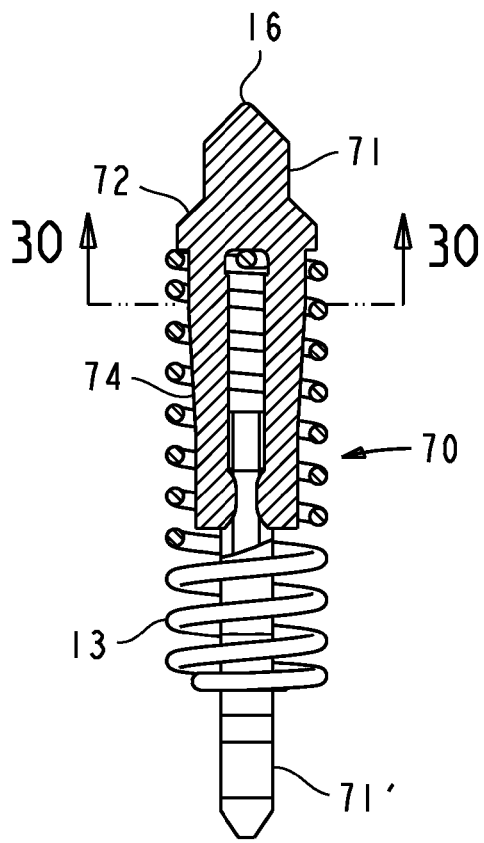

FIG. 29 is a partially cross-sectioned front view of the contact probe of FIG. 26.

Figure 30:
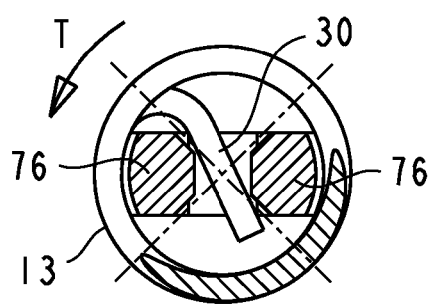

FIG. 30 is a cross-sectional view of a plunger engaged to a spring, taken as indicated by the lines 30-30 of FIG. 29.

Figure 31:
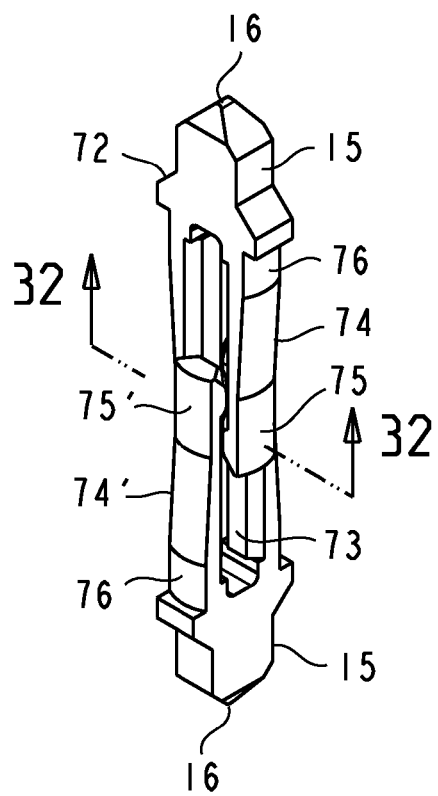

FIG. 31 is a perspective view of retentively engaged plungers with the spring omitted.

Figure 32:
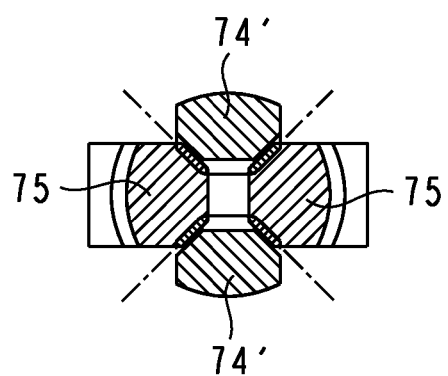

FIG. 32 is a cross-sectional view of engaged plungers, taken as indicated by the lines 32-32 of FIG. 31.

Figure 33:
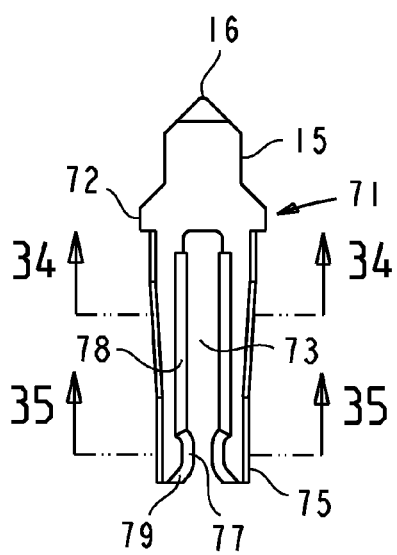

FIG. 33 is a front view of a plunger having stepped canted coupling surfaces.

Figure 34:
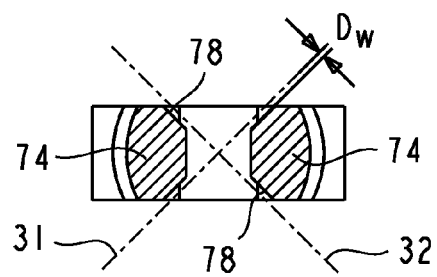

FIG. 34 is a cross-sectional view of the plunger of FIG. 33, taken at the widely-spaced canted surfaces, as indicated by the lines 34-34 of FIG. 33.

Figure 35:
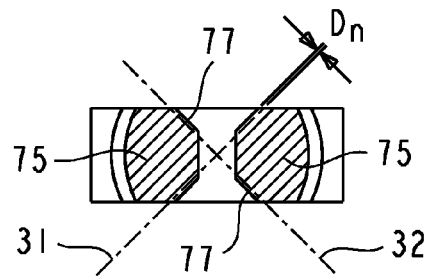

FIG. 35 is a cross-sectional view of the plunger of FIG. 33, taken at the narrowly-spaced canted surfaces, as indicated by the lines 35-35 of FIG. 33.

Figure 36:
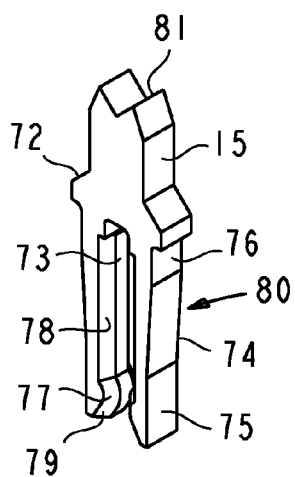

FIG. 36 is a perspective view of a plunger having stepped canted surfaces and a slotted contact tip.

Figure 37:
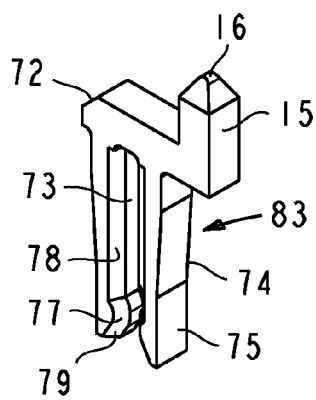

FIG. 37 is a perspective view of a plunger having a contact portion adapted for a staggered mounting.

Figure 38:
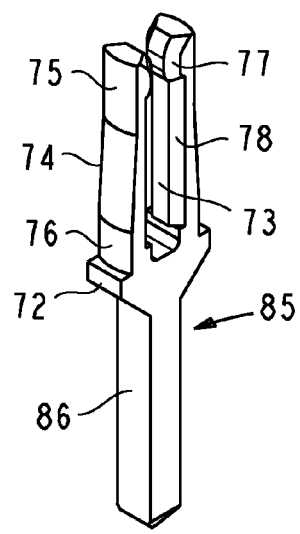

FIG. 38 is a perspective view of a plunger having stepped canted surfaces and a tail adapted for a permanent solder connection to a plated-through hole of a PCB.

Figure 39:
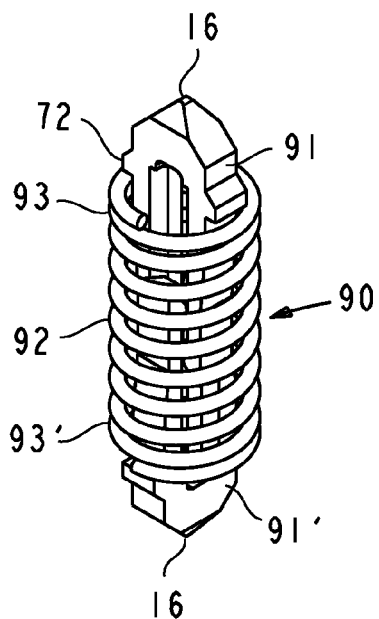
Figure 39:
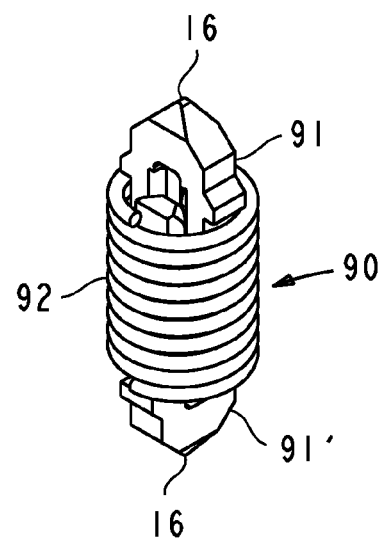

FIG. 39A shows a contact probe having plungers with stepped canted surfaces and a coil spring with conventional end coils.

FIG. 39B shows the contact probe of FIG. 39A in a fully compressed state.

Figure 40:
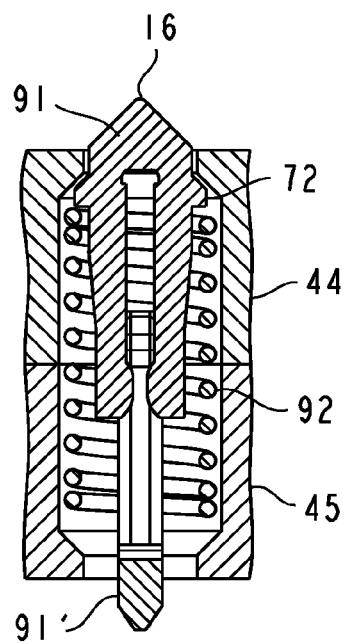
Figure 40:
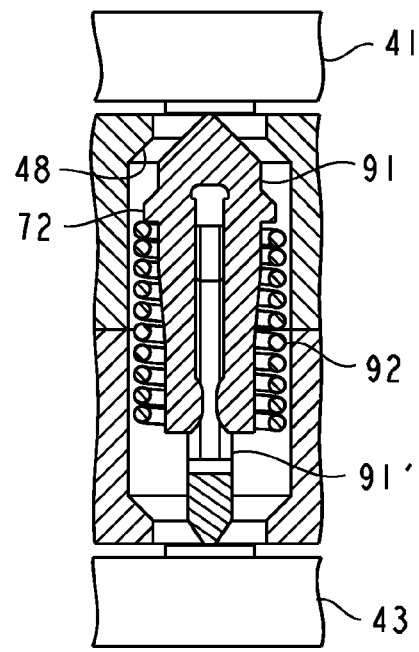

FIG. 40A is a cross-sectional detail of an interposer connector, showing the probe of FIG. 39A assembled in a cavity of an insulative housing.

FIG. 40B is a cross-sectional detail of an interposer connector, showing the probe of FIG. 39A assembled in a cavity of an insulative housing and fully compressed between a terminal of the first device and a corresponding terminal of the second device.

Figure 41:
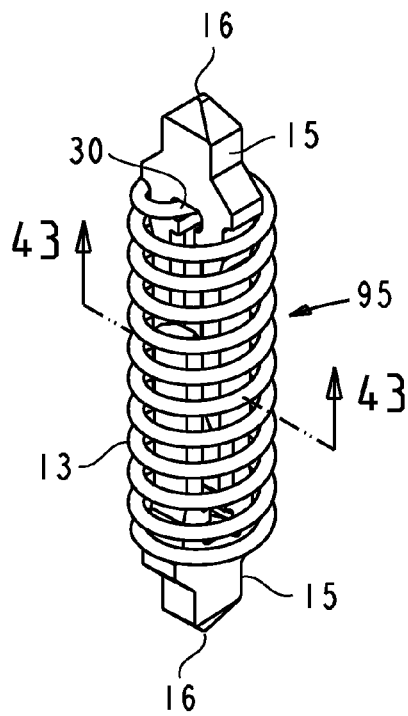
Figure 42:
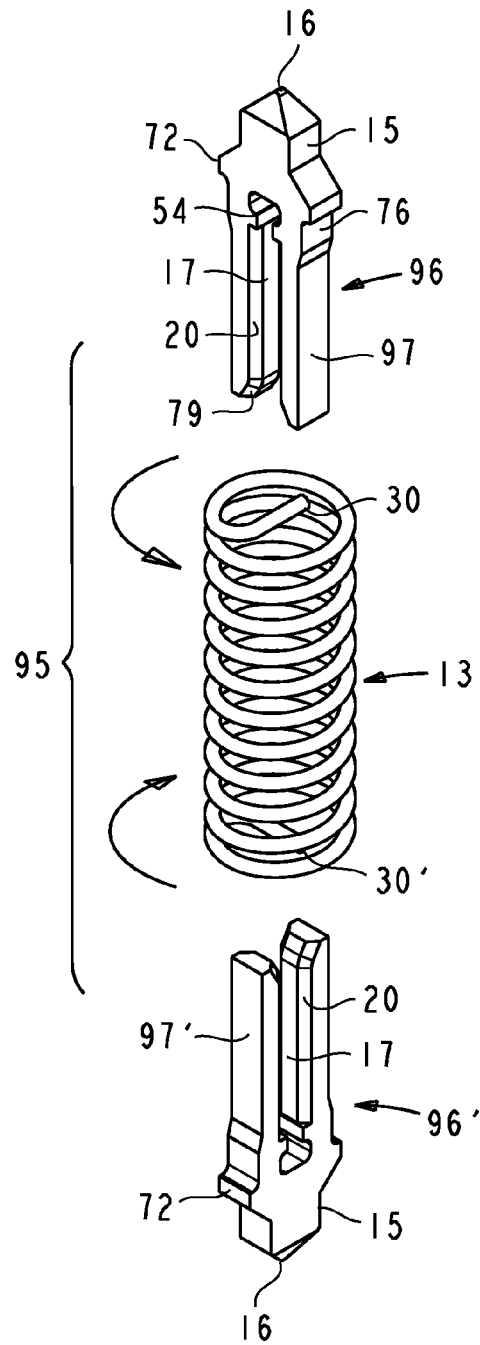

FIGS. 41-42 show a contact probe comprising plungers with canted coupling surfaces and having ledges for captivating end filars of the spring.

Figure 43:
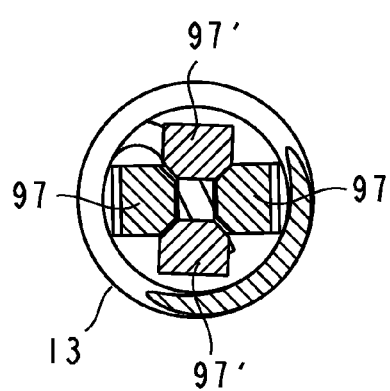

FIG. 43 is a cross-sectional view of the contact probe of FIG. 41, taken at the mid-point of the probe's length, as indicated by the lines 43-43 of FIG. 41.

Figure 44:
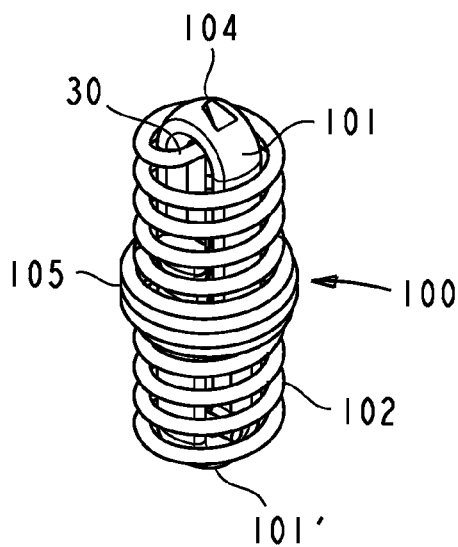

FIG. 44 is a perspective view of a contact probe having stamped U-shaped plungers.

Figure 45:
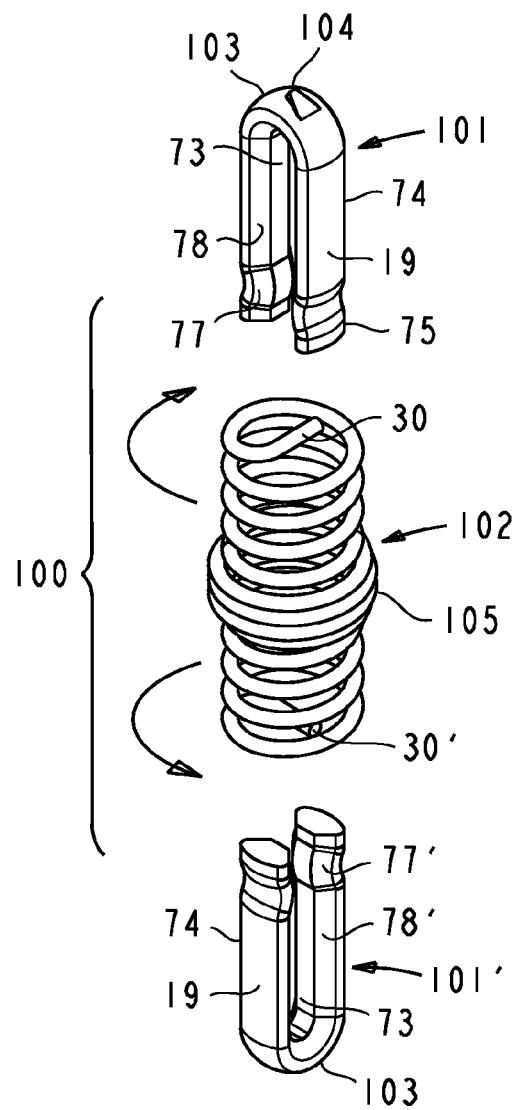

FIG. 45 is an exploded perspective view of the contact probe of FIG. 44.

Figure 46:
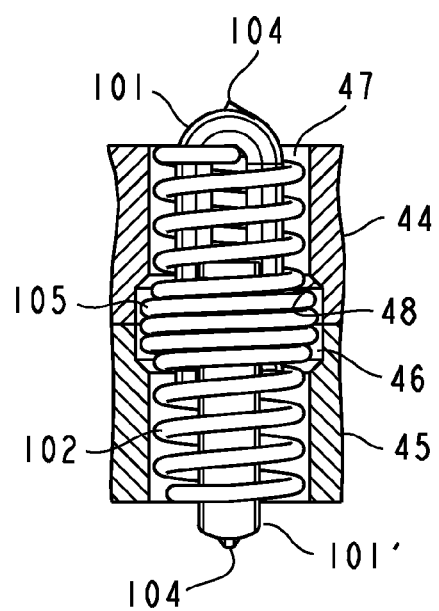

FIG. 46 is a cross-sectional detail of an interposer connector utilizing contact probes of FIG. 44.

Figure 47:
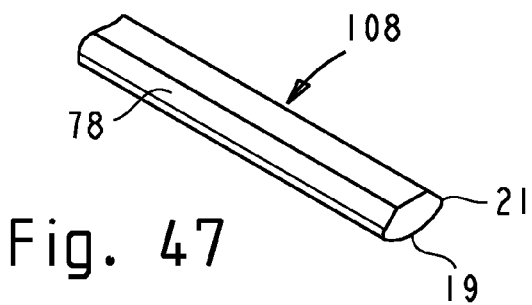

FIG. 47 is a partial perspective view of a profiled stock which can be used for making U-shaped plungers.

Figure 48:
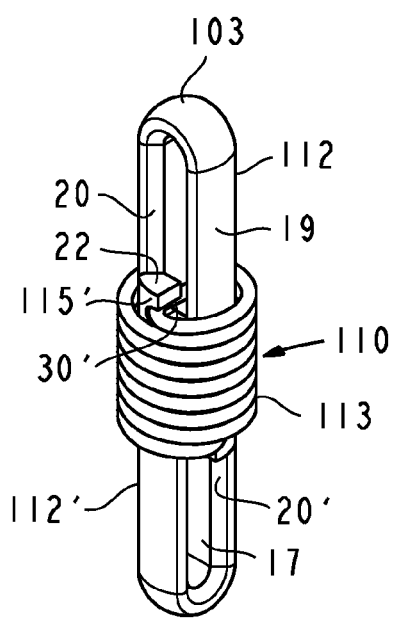

FIG. 48 is a perspective view of a contact probe having plungers biased by an extension spring, wherein the ends of the spring are captivated by hooks on the inner ends of the plunger tines.

Figure 49:
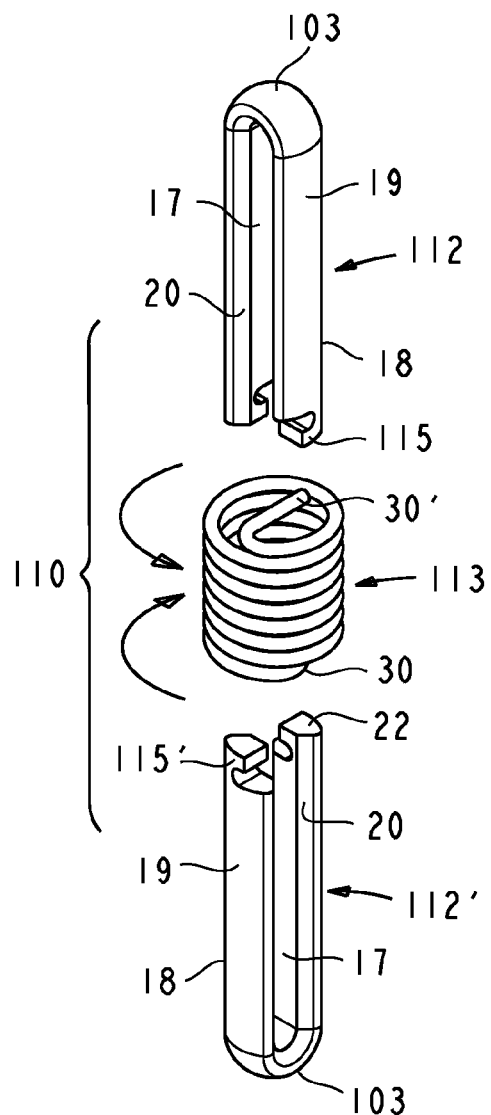

FIG. 49 is an exploded perspective view of the contact probe of FIG. 48.

Figure 50:
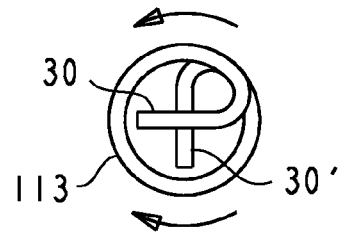

FIG. 50 is a bottom view of a twisted extension spring wherein the end filars are aligned for entry into the slots of respective plungers.

Figure 51:
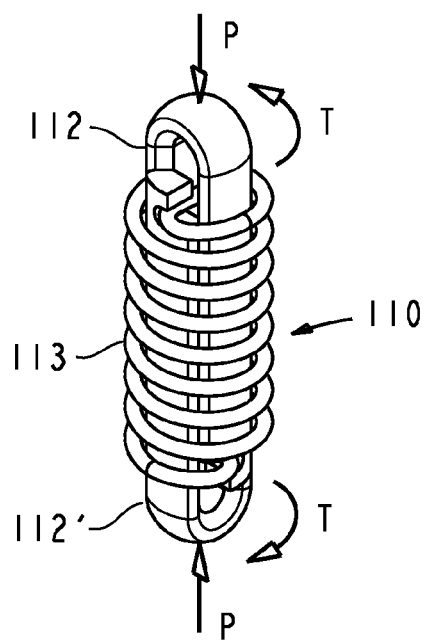

FIG. 51 shows a fully compressed contact probe of FIG. 48 with the axial bias provided by the extended spring.

FIGS. 52-53 and 54A-B show a contact probe comprising self-latching plungers having diagonally disposed tines with stepped coupling surfaces.

Figure 55:
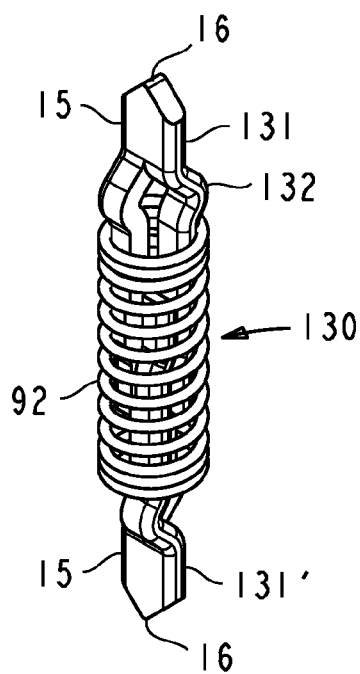
Figure 56:
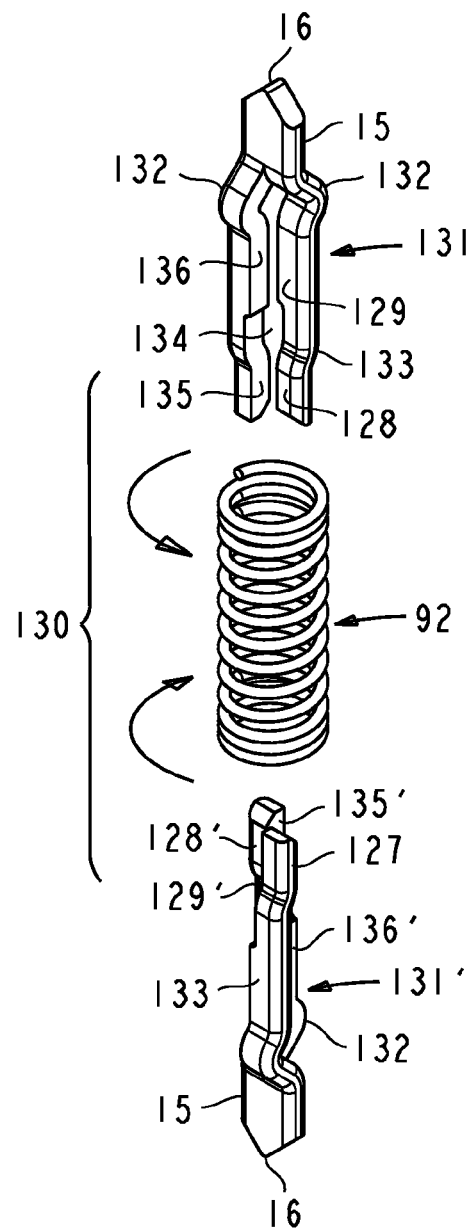
Figure 57:
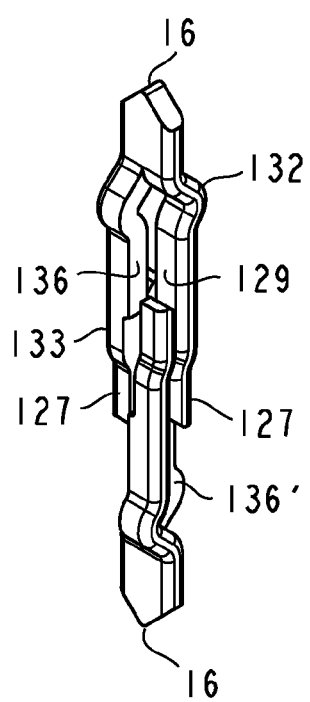

FIGS. 55-57 show a contact probe comprising self-latching plungers having partially sheared diagonally disposed tines and utilizing a coil spring with conventional coiled ends.

FIGS. 58-61 show a contact probe comprising plungers having sheared diagonally disposed tines.

Figure 62:
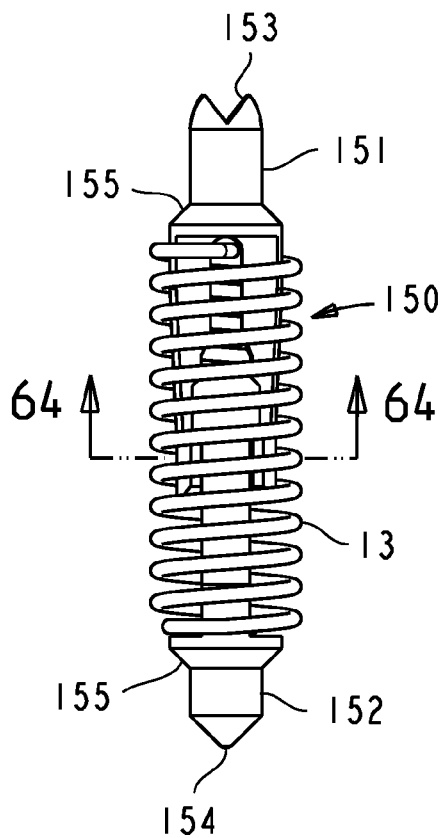
Figure 64:
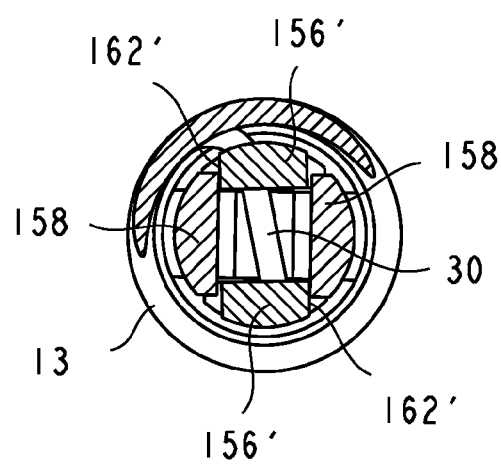
Figure 63:
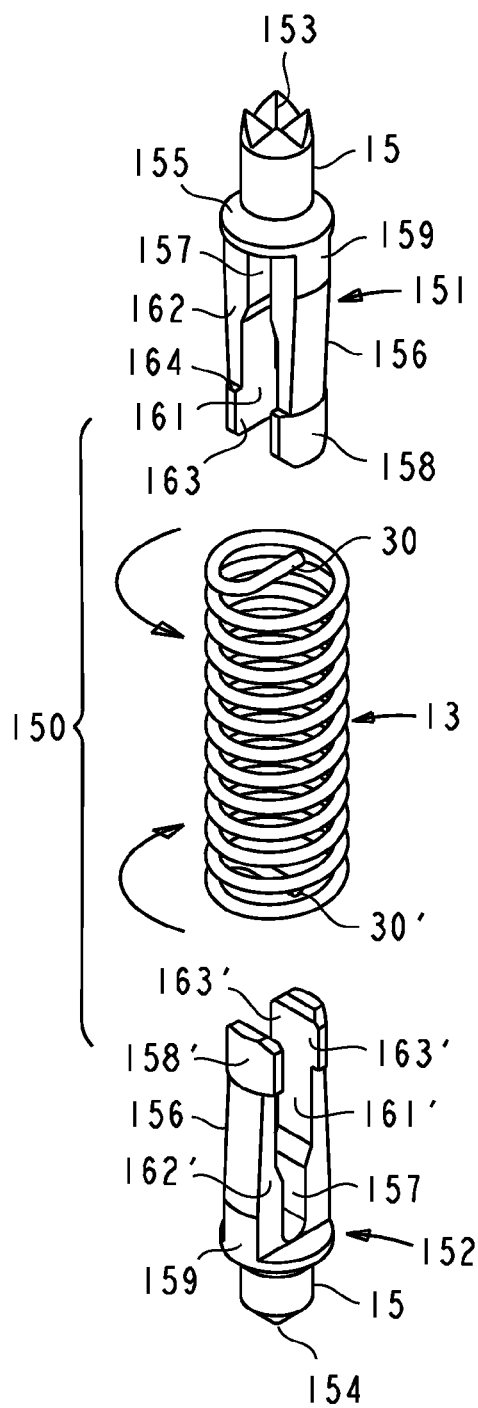

FIGS. 62-64 show a contact probe comprising plungers having tines with self-latching paddle-shaped ends.

Figure 65:
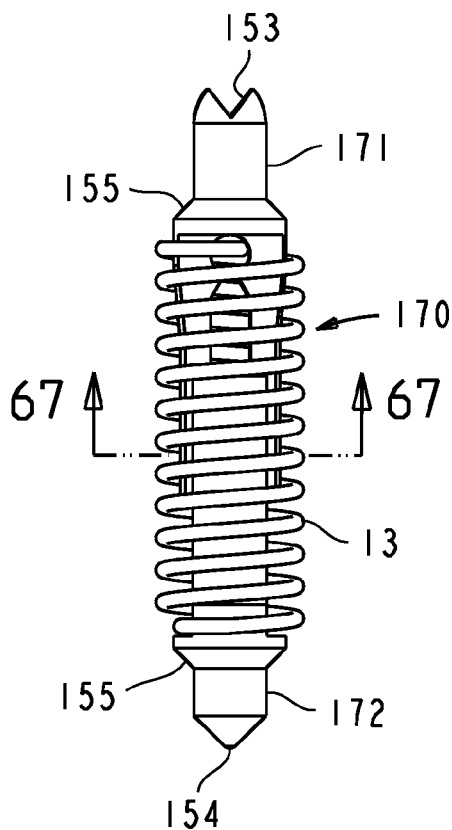
Figure 66:
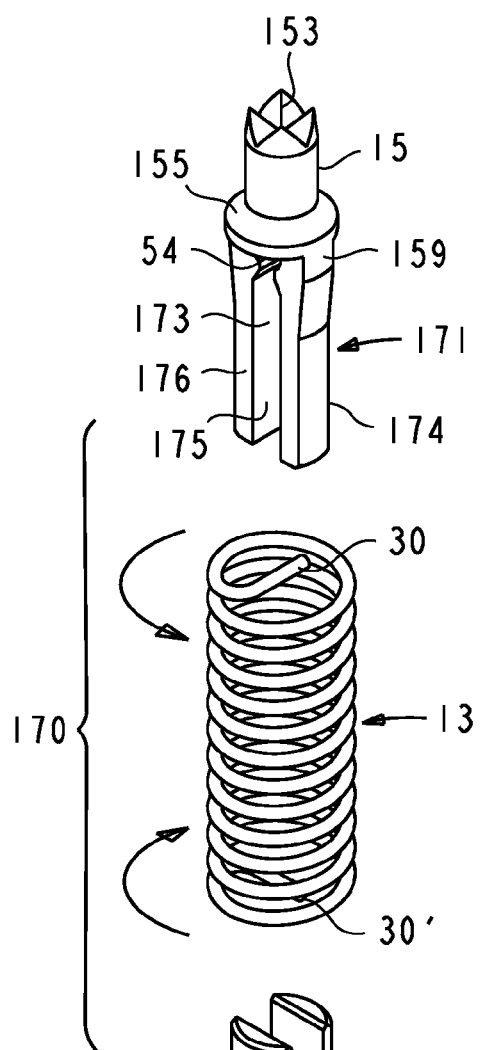
Figure 67:
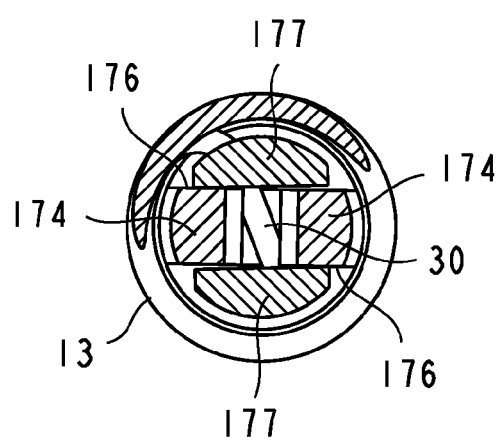

FIGS. 65-67 show a contact probe comprising plungers with orthogonal coupling surfaces and adapted for a retentive engagement with the spring.

Figure 68:
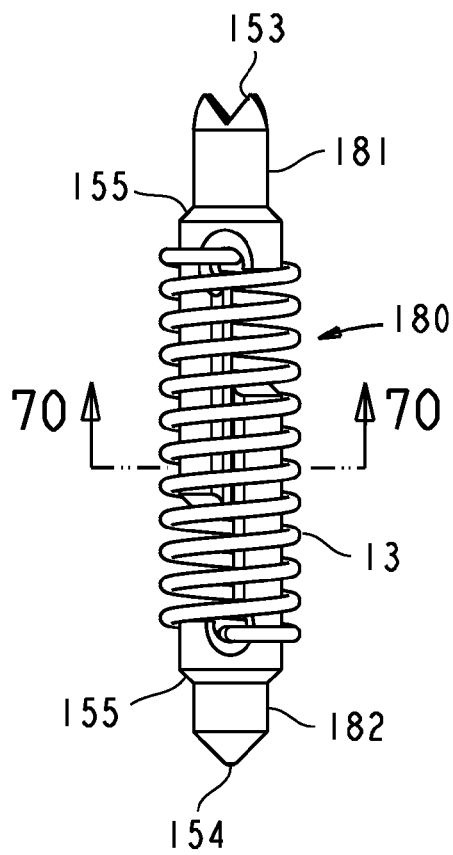
Figure 70:
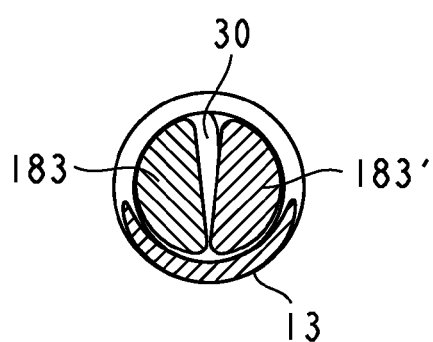
Figure 69:
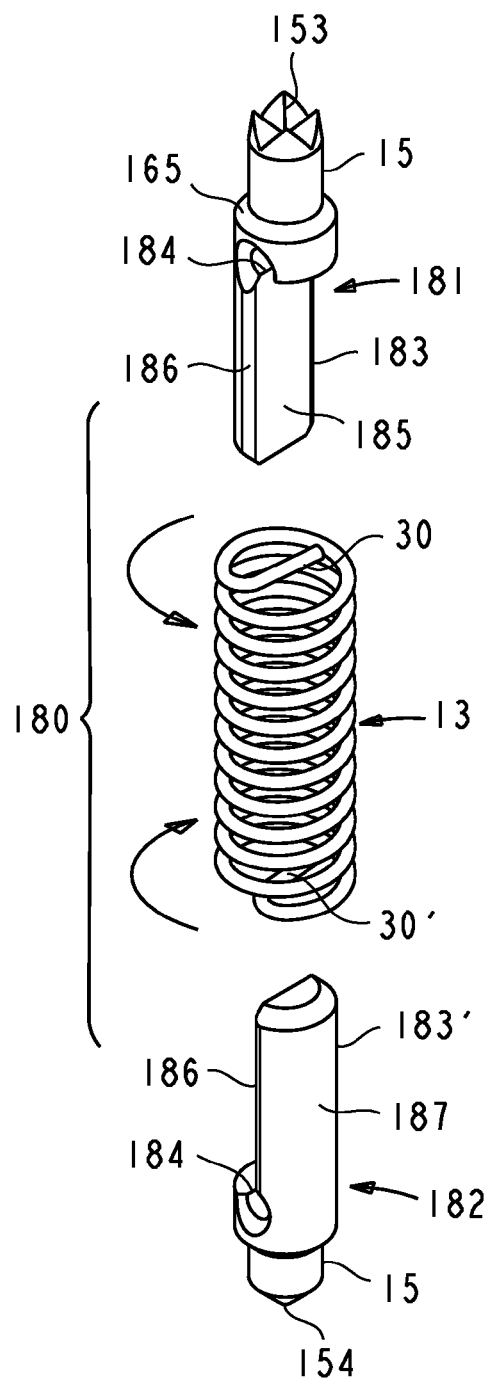

FIGS. 68-70 show a contact probe comprising plungers having a single coupling tine, wherein the plungers are torsionally biased by a spring having end filars.

Figure 71:
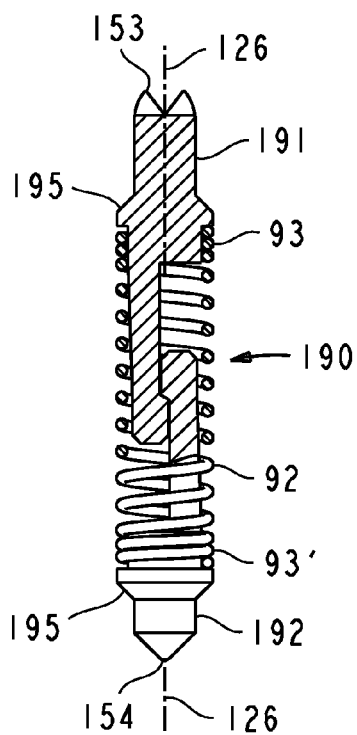
Figure 73:
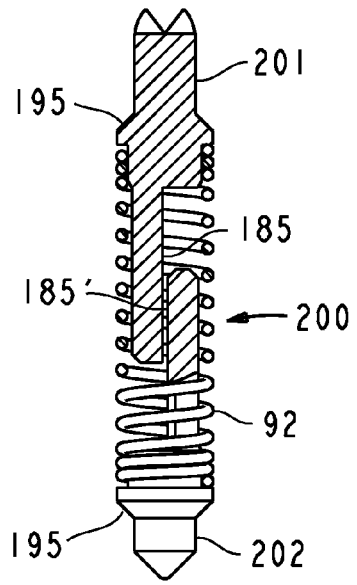
Figure 72:
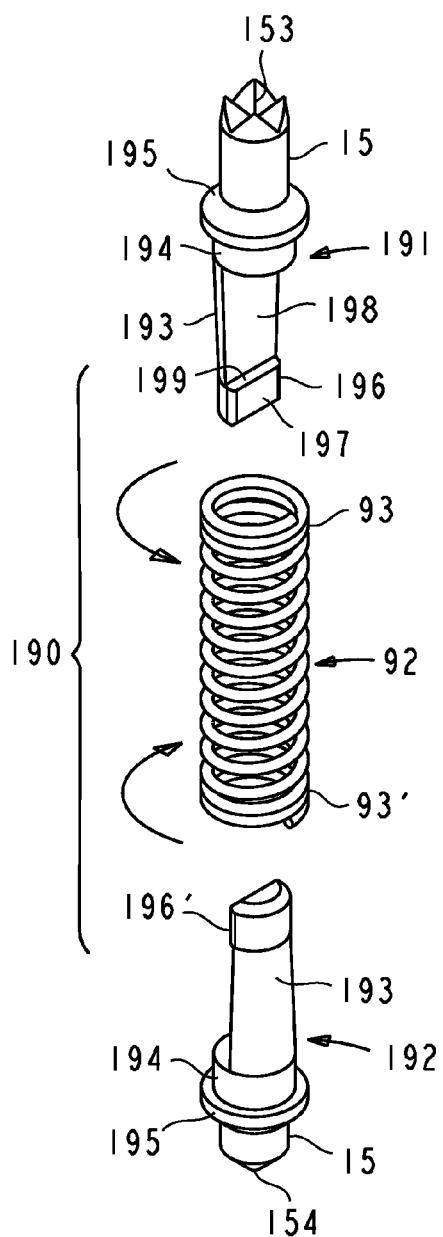
Figure 74:
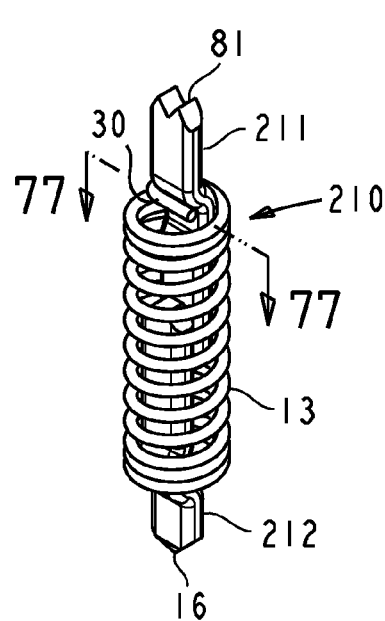
Figure 75:
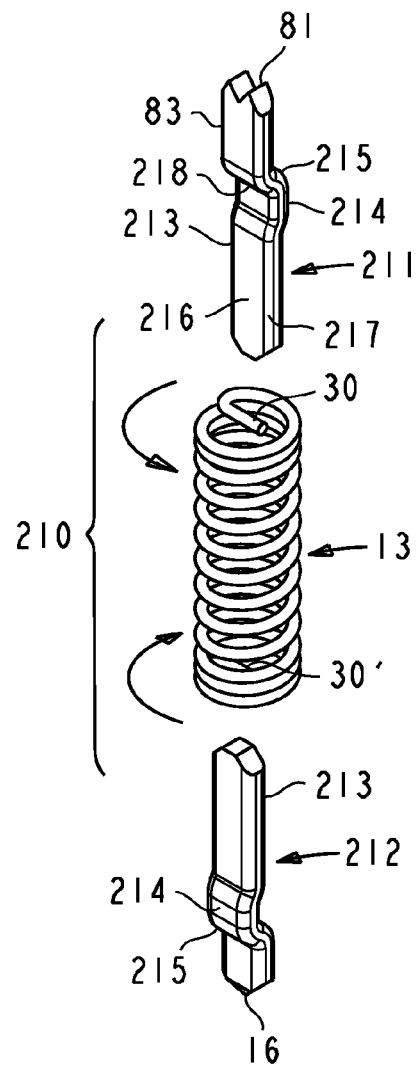
Figure 76:
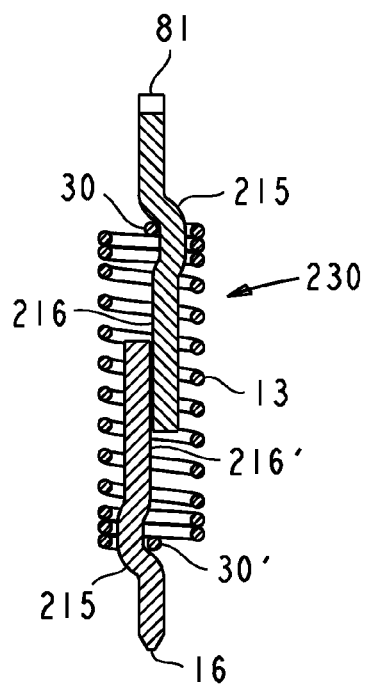
Figure 77:
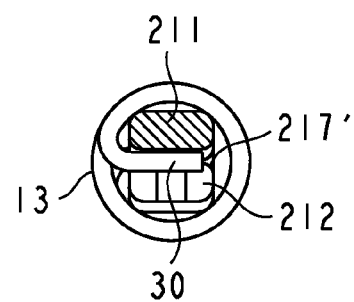

FIGS. 71-73 show contact probes comprising plungers having a single coupling tine, wherein the plungers are torsionally biased by a spring having conventional coiled ends.

FIGS. 74-77 shows a contact probe comprising stamped plungers having a single coupling tine.

DETAILED DESCRIPTION

The disclosed contact probes are utilized in interposer sockets and connectors for separably connecting oppositely disposed electronic devices having complementary I/O terminal arrays. "First device" will generally refer to the device that is being plugged or connected whereas "second device" will generally refer to the next level device or hardware to which the first device is being separably connected, usually represented by a PCB. The "first plunger" is disposed to contact the first device and is shown on the top side of the contact probe drawings, whereas the "second plunger" is disposed to contact the second device and is shown on the bottom side of the contact probe drawings. Otherwise, a contact probe can have identical, interchangeable plungers and the devices can have identical terminal type (e.g., LGA pads). In the cases where the plungers are identical or have substantially similar features, they are denoted by the same reference numerals, except the reference numerals of the second plunger, second end, etc, are primed when it is required for clarity.

"Coupling surfaces" shall include flat surfaces, curved surfaces, and adjoining edges, which may come in contact when a torsional bias is present. "Non-rotatable engagement" of plungers and spring refers to a condition under torsional bias, a limited rotation (within small clearance between coupling surfaces) or rotation in the direction opposite to the torsional bias may be otherwise possible. The contact probes disclosed are referred to as "probes", which implies a temporary connection (e.g., between a device and a test system) but they can also be advantageously used in sockets and connectors for any applications which require high performance interposer sockets and connectors were low inductance, low resistance, low wear, high compliance, and/or close contact spacing is required. The contact probes can be used as an alternative to more conventional contact technologies in end products such as consumer electronics, aerospace systems, medical devices, and alike.

FIGS. 1-4—Contact Probes Having Plungers with Canted Coupling Surfaces

Figure 5:
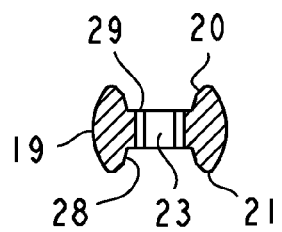
FIG. 5 is a bottom view of the plunger showing the plunger's cross-sectional profile.

FIG. 1 shows a contact probe 10 which can be used in an interposer connector. The contact probe comprises a first plunger 12, a second plunger 12', and a compression coil spring 13. All components have a central longitudinal axis and are coaxially disposed. Each plunger comprises a coupling means 14, which enables the plungers to be slidably and non-rotatably engaged to each other, and a contact portion 15 having a contact tip 16 adapted for making a separable conductive connection to a terminal of an electronic device. The plungers are better revealed in the exploded view of FIG. 2 and FIGS. 4-5. Each plunger has a slot 17 which separates two tines 18, each tine having outside surface 19, canted surfaces 20 with adjoining edges 21, and an inner end 22. The slot has a closed end 23 and an adjoining narrowing 24. The free end portions of the tines have detents 25, which project into the slot and, when the plungers are being assembled, rely on resiliency of the tines to latch the plungers to each other. Each plunger further has shoulders 26, which provide a means for retaining the contact probe in a cavity of an insulating housing. Chamfers 27 on the leading edges of the canted surfaces facilitate initial engagement of the plungers at assembly. FIG. 5 is a cross-sectional view of the plunger, taken through the slot narrowing, showing a bow tie shaped cross-sectional profile formed by the arcuate outside surfaces 19, canted surfaces 20, round edges 21, inside surfaces 28, and flat sides of rib 29. Rounded edges 21 provide smooth transition between canted surfaces 20 and outside surface 19. The slot features are disposed substantially within the rib.

Figure 3:
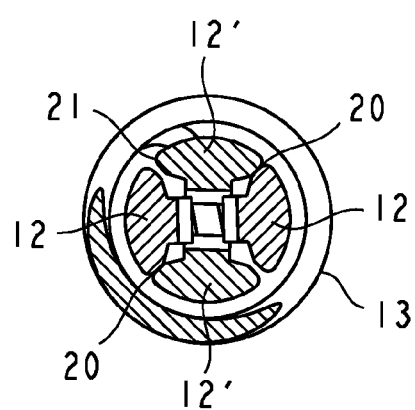
FIG. 3 is a cross-sectional view of the contact probe of FIG. 1, taken at the mid-point of the probe's length, as indicated by the lines 3-3 of FIG. 1.
Figure 2:
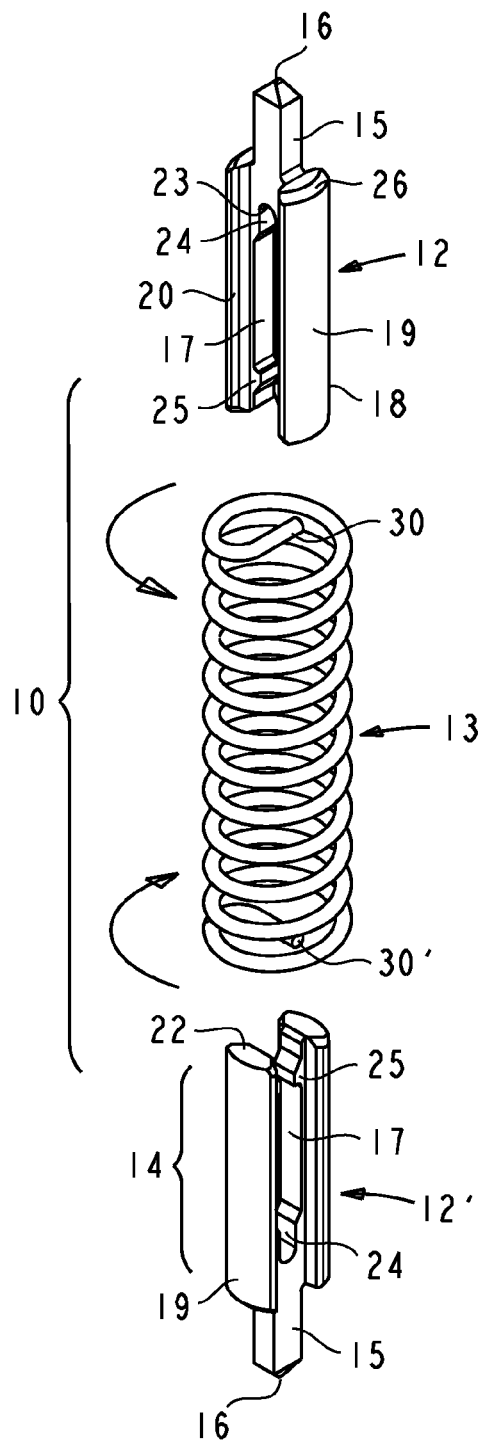
FIG. 2 is an exploded perspective view of the contact probe of FIG. 1.
Figure 4:
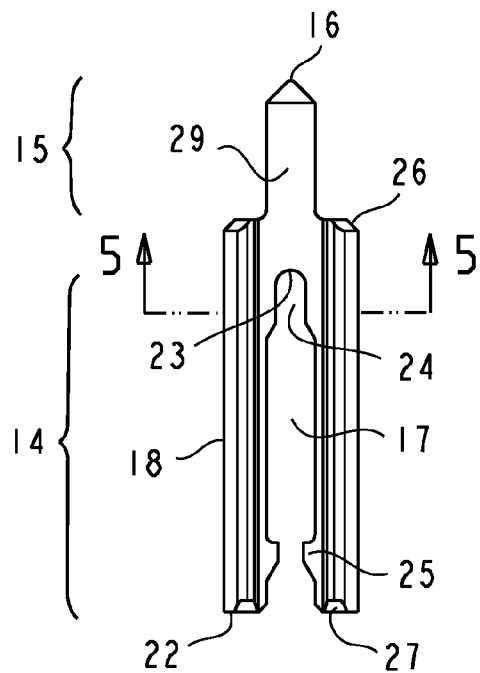
FIG. 4 is a front view of the plunger used in the contact probe of FIG. 1.

The coil spring has a first end and a second end cooperating with the first and the second plunger respectively. The spring further has a radially and inwardly formed filar 30 at the first end and a similar filar 30' at the second end. When the plungers are oriented at a right angle to each other as shown in FIG. 2, the coupling means of the plungers can be slidably and non-rotatably engaged to each other along the canted surfaces. In order to simultaneously engage the spring, the filars must also be substantially at a right angle to each other, so that they align with the slots of the respective plungers. When fully engaged, the filars are supported by slot edges coincident with closed ends 23 of respective slots. When the contact probe is compressed, the inwardly displaced plungers bear on the respective filars of the spring, which provides the requisite contact force, or axial bias, to the plungers. The filars are captivated in the slots of respective plungers in a manner that prevents rotation of the spring's ends. This allows the spring to be attached to the plungers with a predetermined angle of twist, indicated by the torque arrows in FIG. 2. The predetermined angle of twist is permanently retained by the plungers and provides a torsional bias for a direct conductive coupling between the plungers. The torsional bias rotatably biases the cooperating coupling surfaces of the plungers against each other, as shown in FIG. 3.

Figure 6:
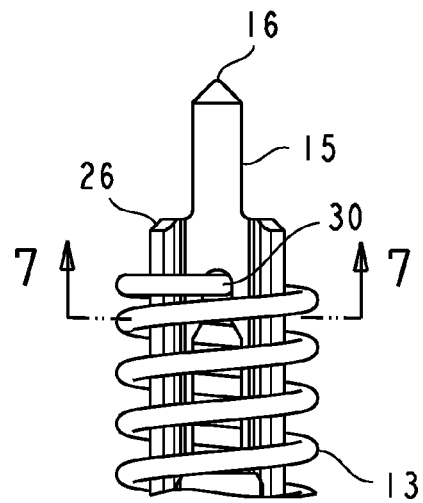
FIG. 6 is a partial front view of a plunger engaged to a spring.
Figure 7:
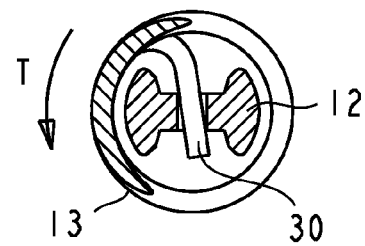
FIG. 7 is a cross-sectional view of the plunger engaged to a spring, taken as indicated by the lines 7-7 of FIG. 6.

FIGS. 6-7 show spring filar 30 non-rotatably captivated at the closed end of the slot in plunger 12. In order to add a predetermined angle of twist at the assembly, the spring is fabricated with the filars being at a desired angle to each other in a free state, designated by $\delta_F$ in FIG. 8A. The free-state angle between the filars is chosen so that when the spring is assembled with the angle between the filars equal to $\delta_A$ (FIG. 8B), the predetermined angle of assembly twist is $\beta i=\delta_A-\delta_F$. Additional torsional bias is contributed by compression of the spring. As the spring is compressed, the coils attempt to distribute the strain energy by unwinding. However, since the ends of the spring are non-rotatably engaged to the plungers, the spring is unable to unwind. Instead, the spring will self-wind and thus acquire a compression-generated bias $\beta c$.

While the compression-generated bias increases with the compressive displacement of the spring and is self-cancelling on spring unloading, the assembly torsional bias is permanent and provides constant contact forces between the coupling surfaces of the plungers. The contact forces generated by the torsional bias enable a direct conductive path through the plungers, while substantially bypassing the spring. The resulting clearance-free sliding fit between the plungers also helps to maintain the coaxiality of the plungers. In addition, the assembly torsional bias can be used advantageously to retentively attach the spring to the plungers, as discussed in connection with contact probe 50.

The compression springs are usually right-hand wound as reflected in the drawings. The assembly twist is shown to be in the spring winding direction so that the spring's urge to unwind creates a torsional bias in the same direction as the compression-generated bias, which is also due to the spring's urge to unwind. The total torsional bias provided by the spring is therefore the sum of the compression-generated bias and the assembly twist $\beta=\beta c+\beta i$. If the spring is preloaded, the compression-generated bias includes the contribution from the compressive preload of the spring. It should be noted that the coil spring used in the contact probes will tend to have a low compression-generated bias. In most cases, an assembly torsional bias will be advantageous to assure a robust conductive coupling between the plungers without relying on random contact between the plungers. The assembly torsional bias can be set to any desired value by fabricating springs with an appropriate angle $\delta_F$ between the filars.

While the compression springs shown in the drawings have assembly twist in the spring's winding direction, it is also possible to have assembly twist in the spring's unwinding direction, in which case the total torsional bias is $\beta=-\beta i+\beta c$. The magnitude and the direction of the actual assembly twist can be determined based on a particular spring type, size, material, desired spring parameters, coupling configuration, contact forces, stress considerations, and other requirements. Furthermore, the above principles are also applicable to left-hand wound springs as well as to the extension springs such as the one used in contact probe embodiment 110 In either case, the direction of the spring winding and the direction of the assembly twist must be properly considered.

FIG. 9 shows plungers 12 and 12' in a mated state. The spring is omitted to fully reveal the plungers, which are slidably and non-rotatably engaged. A compressive displacement of the spring generates axial force "P" which provides the axial bias to the plungers. The spring further provides a torsional bias to the plungers, which is indicated by the torque arrows marked "T". The torsional bias generates contact forces at the canted surfaces of the plungers, indicated by the arrows marked "F" in FIG. 11. The contact force F=T/a, where "a" is the distance between the coupling forces F, as shown in FIG. 11. In general, the magnitude of the contact force at the canted surfaces will be a fraction of the axial force P, e.g., ¼ of P, or less. This will assure that the sliding friction due to the rotational coupling is easily overcome by the axial bias of the spring, so that the plungers deliver the required contact force to the respective I/O terminals and can return to the original extension after the axial force is removed.

FIGS. 10-13 are cross-sectional views of the plungers taken at the mid-point of the probe. The initial spacing between the canted surfaces is exaggerated to show the coupling configurations clearly. In FIG. 10, the plungers are in an unbiased or reference state. The canted surfaces of the plungers are spaced equally from each other and are equidistant from diagonals 31 and 32. FIG. 11 shows the plungers in a conductive coupling. As the torsional bias is applied, the plungers rotate about their longitudinal axes in opposite directions to overcome the small clearance between the canted surfaces. The torque arrows indicate the direction of plunger rotation. The canted surfaces adjacent to diagonal 31 pull away from each other while the surfaces adjacent to diagonal 32 are brought into contact.

In FIGS. 10-13 the canted surfaces in each tine form an included angle that is equal to 90 degrees. Without a torsional bias, the adjacent canted surfaces of the plungers are parallel to each other and to the diagonals. When the plungers are made from a drawn profiled wire, the canted surfaces and the adjoining round edges are defined by the drawing process, which provides smooth and dimensionally precise coupling surfaces. The canted surfaces can also be formed by coining edges of the slot as shown in FIG. 13. The canted surfaces are well suited for torsionally biased hermaphroditic coupling means; they are space efficient, maintain coaxiality of the plungers, and support torsional bias in either direction. However, there are many other possible coupling configurations that can be employed for use in contact probes having rotatably biased plungers, as exemplified by cross-sectional views of FIGS. 61, 64, 67, 70, and 77.

FIG. 14 is a partially cross-sectioned front view of contact probe 10 showing plunger latching. The detents are independent of the coupling surfaces and do not add to the plunger length. FIG. 15 is a cross-sectional bottom view of the latched plungers taken just below detents 25, with the spring omitted and without torsional bias (coupling surfaces not rotatably biased). The engaged areas are shown as four shaded rectangles in the cross-sectional view of FIG. 15. The positively engaged plungers can retain the spring in a preloaded state. A preload is generated when a free-state length of the spring $L_F$ is greater than the distance between the closed ends of the plunger slots $L_A$, as shown in FIG. 16. When the probe is assembled, the magnitude of the spring preload is equal to $L_F-L_A$.

FIG. 17 shows a profiled stock 35 from which the plungers can be fabricated. A profiled stock is well suited for fabrication of plungers with hermaphroditic coupling means. Since the coupling means of both plungers are identical, only one part (the stock) needs to be dimensionally controlled to achieve the desired coupling. The profiled stock can be obtained by rolling or by drawing a continuous wire or rod through successive dies until the final geometry is attained. This allows the essential features of the plunger such as the canted coupling surfaces with the adjoining edges, the outside surfaces, and the rib, to be prefabricated in the profiled stock with a high degree of dimensional accuracy and reproducibility. In particular, the profiled stock provides smooth coupling surfaces with a desired geometry and tight dimensional tolerances. The profiled stock can be used to fabricate plungers by stamping, machining, electrical discharge machining, and alike.

FIGS. 18A-B show cross-sectional details of an interposer connector for connecting an LGA I/O terminals 40 of a first device 41, to oppositely disposed terminals 42 of a second device 43. The contact probes are contained in a two-piece housing comprising a first piece 44 and a second piece 45. The two pieces of housing form an inner opening 46 which accommodates the coupling means of the plungers and the spring. Each piece of housing further has an outer opening 47 which guides the contact portion 15 of the plunger. The outer openings have a smaller diameter than the inner opening, forming retaining surfaces 48. The retaining surfaces cooperate with the shoulders of respective plungers to prevent the plunger from escaping the cavity and to provide a bearing surface when the plungers are preloaded against those surfaces. The two pieces of housing do not need to be identical. For example, the bottom piece can be thinner or in the form of a retaining plate, as shown in FIG. 25. The cavity features shown in the cross-sectional drawings can be viewed as round, consistent with drilling and reaming, but other shapes can be obtained by milling or molding.

FIG. 18A shows contact probe 10 assembled in a cavity of an insulative housing and preloaded against a terminal of the second device. The second plunger is axially displaced and exerts a contact force against a terminal of the second device. Shoulders 26 of the first plunger are preloaded against the retaining surface in the first piece of the insulator housing. The contact portion of the first plunger extends a predetermined distance from the insulator housing. When the first device is forced against the connector as shown in FIG. 18B, the contact probe is fully compressed between corresponding I/O terminals of the first and the second device.

FIGS. 19-25—Contact Probes Having Shoulder-Less Plungers and Canted Coupling Surfaces Disclosed in this section are probes having shoulder-less plungers with a substantially constant outer profile. Instead of retention shoulders, the ends of the spring are used to retain the contact probe in an insulator cavity. This reduces the contact probe length and simplifies plunger fabrication from profiled stock 35. The plungers can be retentively attached to each other using detents 25, as in contact 10, and/or the plungers can be retentively attached to the spring using a torsional bias of the spring.

Figure 21:
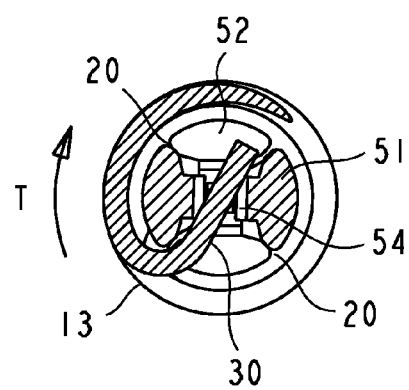
Figure 20:
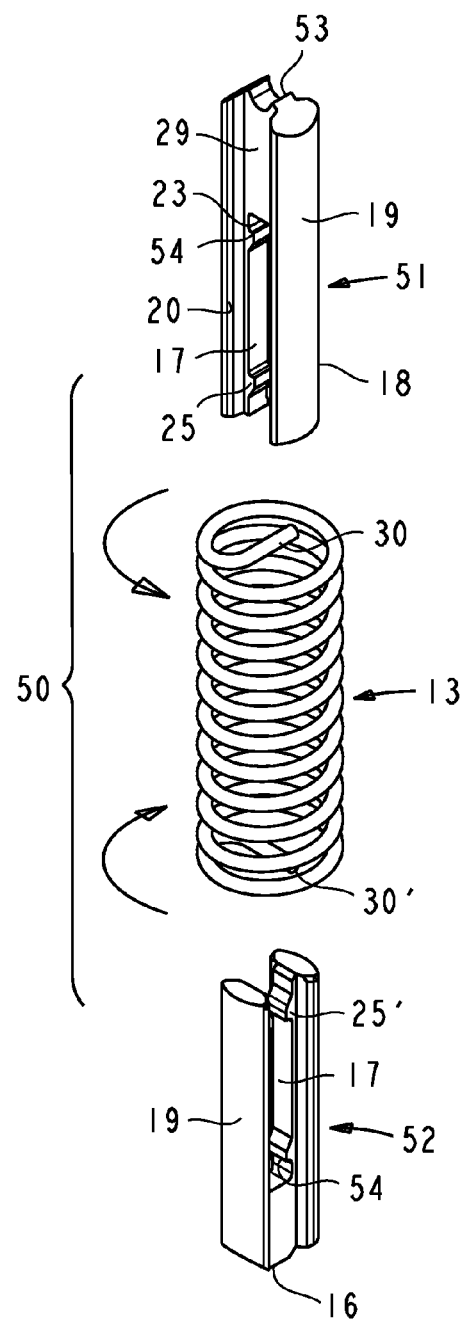
Figure 22:
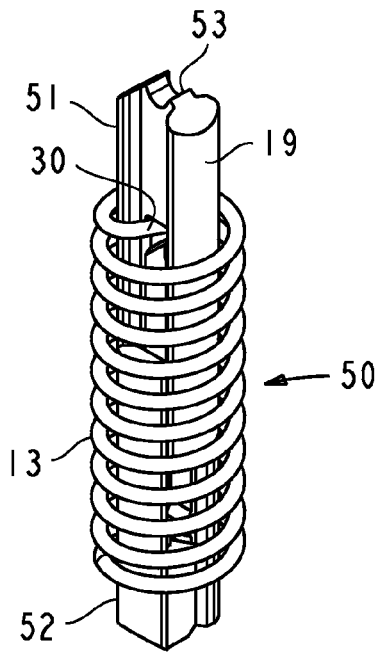

A contact probe 50 comprises a first plunger 51, a second plunger 52, and a compression coil spring 13. Each plunger has a continuous outside surfaces 19 throughout its length. The first plunger has a slotted contact tip 53 suitable for connecting to a solder ball terminal of a BGA device. The second plunger has a pointed contact tip, suitable for connecting to an LGA terminal. Each plunger further has a slot 17 having a closed end 23. Adjoining the closed end of the slot are ledges 54 which enable a retentive engagement of the spring ends to the plungers using a torsional bias of the spring. The torsional bias is generated when the spring is twisted, as shown in FIG. 20, before the filars engage the respective plunger slots. When filar 30 engages slot 17 passed the ledges, the torsional bias of the spring, indicated by the torque arrow marked "T" in FIG. 21, urges the filar to rotate behind the ledges, thus retentively attaching the spring end to the respective plunger. The resulting attachment is shown on the cross-sectional view of FIG. 21, where the filar is seen trapped behind ledges 54. The plungers can thus be retentively attached to each other using the latching detents, and/or the plungers can be attached to the spring ends using the ledges. In either case, the contact probe assembly, as shown in FIG. 22, can be handled as a unit.

FIGS. 23-24 show plunger variations for contact probe 50. Plunger 55 of FIG. 23 does not have latching detents. However, the plunger can be retentively attached to the spring using the torsional bias of the spring, as shown in FIG. 21. A contact probe 60 of FIG. 24 has both plungers with a pointed contact tip, suitable for connecting to LGA terminals.

FIG. 25 is a cross-sectional detail of an interposer connector utilizing contacts 50, or alike, for connecting BGA terminals 61 of a first device 62, to oppositely disposed LGA terminals 42 of a second device 43. The insulator housing comprises a first piece 44 and a second piece, or retaining plate, 63. The first piece has an inner opening 46 which accommodates the coupling means of the plungers and the spring. The first piece of housing further has an outer opening 47 which guides plunger 51. The outer opening has a smaller diameter than the inner opening, forming retaining surface 48. The retaining plate has a hole 47' which has a smaller diameter than the inner opening and guides the contact portion of the second plunger. The retaining surfaces in the first piece of housing and in the retaining plate cooperate with the respective end coils of spring 13 to retain the contact probe in the insulator housing cavity. This retention method obviates the need for retention shoulders in the plungers, and allows the entire contact portion of the plunger to be guided in the outer openings 47. A floating base 64 has guide holes 65 which can be used to align and guide the BGA device as it engages the contact probes.

FIGS. 26-43—Contact Probe Having Plungers with Stepped Canted Coupling Surfaces

The contact probes disclosed in this section have stepped canted coupling surfaces which also provide latching detents for a retentive engagement between the plungers. The detents prevent the plungers from separating and enable the plungers to retain the spring in a preloaded state. The plungers can be stamped from a strip stock using progressive die stamping technology.

FIG. 26 is a perspective view of a contact probe 70 comprising a first plunger 71, a second plunger 71', and a coil spring 13. The components are better revealed in the exploded view of FIG. 27. Each plunger has a contact portion 15 comprising a pointed contact tip 16, and retention shoulders 72. Each plunger further has a coupling means comprising a slot 73 and two tines 74. Each tine has a free end portion 75 and a fixed end portion 76. Each tine further has stepped canted coupling surfaces; narrowly-spaced canted surfaces 77 on the free end portion of the tine, and widely-spaced canted surfaces 78 along the remaining portion of the tine. The steps from the narrowly-spaced canted surfaces to the widely-spaced canted surfaces serve as latching detents which enable the plungers to be retentively engaged to each other. The free end portion of each tine further has canted lead-in surfaces 79 which facilitate initial engagement between the narrowly-spaced canted surfaces of the plungers. When the plungers are engaged passed the narrowly-spaced canted surfaces, the plungers are retentively attached to each other and the narrowly-spaced canted surfaces of one plunger are slidably and non-rotatably coupled to the widely-spaced canted surfaces of the other plunger, as shown in FIG. 28. The spring is attached to the plungers with a predetermined angle of twist which provides a torsional bias to the plungers. The torsional bias rotatably biases the narrowly-spaced canted surfaces of one plunger against the cooperating widely-spaced canted surfaces of the other plunger to provide a direct conductive coupling between the plungers.

FIGS. 29-30 detail the attachment of the spring to the plungers. Referring to FIG. 29, the width of the plunger across the fixed end portions 76 of the tines is sized to locate, or closely guide, the spring. The tines are tapered to enable the tines to spread outwardly within the spring when the narrowly-spaced canted surfaces are being forcibly engaged. The spring is supported between the closed ends of the slots and/or between the retention shoulders. The spring is compressibly preloaded, which biases the plungers outwardly against the latching detents. The spring filars engage the slots of the respective plungers and transmit the torsional bias to the plungers as shown in FIG. 30.

FIGS. 31-35 provide further details of contact probe 70 construction and plunger coupling. FIG. 31 shows plunger engagement with the spring omitted to fully reveal the plungers. In order to retentively engage the plungers, the narrowly-spaced canted surfaces must be forcibly engaged passed each other to overcome the interference between the narrowly-spaced canted surfaces of the plungers, shown shaded in the cross-sectional view of FIG. 32. Once the narrowly-spaced canted surfaces are forced passed each other, the tines spring back and the narrowly-spaced canted surfaces are coupled to the widely-spaced canted surfaces of the other plunger. Nominally, i.e., without torsional bias, the narrowly-spaced canted surfaces are separated from the widely-spaced canted surfaces by a small clearance, which can be seen in FIG. 32.

FIGS. 33-35 explain the relationship between the canted surfaces of the plunger. FIG. 34 is a cross-sectional view of the plunger, taken at the widely-spaced canted surfaces, as indicated on the front view of the plunger in FIG. 33. The widely-spaced canted surfaces are below respective diagonals 31 and 32, and are separated from the diagonals by a distance D. The narrowly-spaced canted surfaces are above the diagonals, and are separated from the diagonals by a distance $D_n$, as seen in FIG. 35. The latching interference between the narrowly-spaced canted surfaces of mating plungers is therefore equal to $2*D_w$. In order to accommodate this interference the free end of each tine must resiliently deflect $\sqrt{2}*D_w$. When the plungers are forcibly engaged passed the narrowly-spaced coupling surfaces, the tines resiliently recover to their original position, and the narrowly-spaced canted surfaces are separated from the opposing widely-spaced canted surfaces by a clearance equal to $D_w-D_n$. This is a nominal clearance, without torsional bias. When a torsional bias is applied, the narrowly-spaced canted surfaces of one plunger are rotatably biased against the cooperating widely-spaced canted surfaces of the other plunger, generating a contact force for a direct conductive coupling between the plungers.

FIGS. 36-38 illustrate additional plunger variations having a contact portion adapted for a specific need. Plunger 80 of FIG. 36 has a slotted contact tip 81 suitable for connecting to a solder ball terminal of a BGA device. Plunger 83 of FIG. 37 has an offset contact portion 15 which can be used in a staggered pattern to reduce the in-line spacing of contact tips. Plunger 85 of FIG. 38 has an extended contact portion 86 suitable for soldering in a plated-through hole of a PCB or for plugging into a socket contact permanently installed in a second device or a PCB.

FIG. 39A shows a low profile contact probe 90 comprising plungers 91 and 91' and a spring 92 having conventional coiled ends 93. Plunger 91 is essentially plunger 71 with the slot extended beyond the retention shoulders to enable the free end portions of the tines to be displaced beyond the ends of the spring. This enables the contact probe to have a very short compressed length as shown in FIG. 39B. The contact probe will therefore have a low self-inductance. FIGS. 40A-B are partial cross-sectional views of an interposer connector in a free state and a mated state respectively. The cavity details for contact 90 are similar to those described earlier. Plunger shoulders 72 cooperate with the respective retaining surfaces 48 in the insulator cavity to retain and preload the contact probe.

FIGS. 41-51—Additional Contact Probes Having Plungers with Canted Coupling Surfaces FIGS. 41-43 show a contact probe 95 which comprises plungers 96 and 96' having tines 97 with straight canted surfaces 20. The plungers are retentively attached to spring 13 by trapping spring filars 30 behind ledges 54 of the respective plungers, using a torsional bias of the spring. Similar plunger features were described earlier in the specification.

Plungers with hermaphroditic coupling means can also be fabricated by forming a drawn profiled stock into a U-shaped configuration. The bottom of the "U" forms a round contact portion while the sides of the "U" provide coupling tines. The contact probes using U-shaped plungers can have the same features and functionality as the probes disclosed above, thus the same reference numerals are used to identify the corresponding features.

FIG. 44 is a perspective view of a U-shaped contact probe 100 which is very short and therefore has a low self-inductance. The contact probe comprises a first plunger 101, a second plunger 101', and a compression coil spring 102. The components are better revealed in the exploded view of FIG. 45. Each plunger has a rounded contact portion 103. A sheared tab 104 may be added to the rounded contact portion to provide a pointed contact tip. Each plunger has slot 73 and tines 74, each tine having narrowly-spaced canted surfaces 77 and widely-spaced canted surfaces 78. The step between the narrowly-spaced canted surfaces and the widely-spaced canted surfaces form latching detents which enable retentive engagement of the plungers to each other, as in contact probes 70 and 90. After the plungers are forcibly engaged passed the narrowly-spaced canted surfaces, the narrowly-spaced canted surfaces of one plunger are slidably and non-rotatably coupled to the widely-spaced canted surfaces of the other plunger. The spring has filars 30 and 30' which are non-rotatably captivated in the slots of the respective plungers. The spring is attached to the plungers with a predetermined angle of twist and the canted coupling surfaces that are rotatably biased against each other provide a direct conductive contact between the plungers. The spring has closely wound middle coils 105 which have a larger diameter than the end coils and form a retention collar, which facilitates retaining the contact probe in an insulator cavity, as shown in the cross-sectional detail of an interposer connector of FIG. 46. The closely wound middle coils also lower the torsional stiffness of the spring without significantly affecting the axial spring rate. A short probe can thus have a low torsional stiffness. FIG. 47 shows a profiled stock 108, from which U-shaped plungers can be formed. All essential surface features, such as canted surfaces 78, outside surface 19, and round edges 21, are present in the profiled stock. Using such profiled stock can be very advantageous for economically producing short contact probes with rounded contact portions.

FIGS. 48-50 disclose a contact probe 110 having U-shaped plungers which are biased by an extension spring. The torsional bias principle is applicable to the extension spring, with the direction of the spring winding and the direction of the assembly twist properly considered. The probe comprises a first plunger 112, a second plunger 112', and an extension coil spring 113. The plungers are substantially U-shaped with the sides of the "U" providing tines 18 and the bottom of the U providing a rounded contact portion 103. The spring has a radially and inwardly formed filar 30 at the first end (facing down) and a similar filar 30' at the second end (facing up). The plungers are slidably and non-rotatably coupled to each other and the respective canted coupling surfaces are brought into conductive contact by a torsional bias of the spring Inner ends 22 of the tines have hooks 115 which enable a retentive engagement of the spring to the plungers using a torsional bias of the spring. When the filars engage the respective hooks, the torsional bias of the spring forces the filars to rotate into the hooks, thus captivating the filars in the hooks. As the coil spring is extended, the coils tend to wind-up. The assembly twist, indicated in FIGS. 49-50 by the torque arrows, is shown in the spring unwinding direction, so that both the extension-generated bias and the assembly bias urge the extension spring to and thus are directly additive. FIG. 51 shows the contact probe under torsional bias, indicated by the torque arrows marked "T". The contact probe is fully compressed with the axial force "P" generated by the extended spring.

FIGS. 52-61—Contact Probes with Plungers Having Diagonally Disposed Tines

The contact probes disclosed in this section have plungers with diagonally disposed tines which enable the plungers to be slidably and non-rotatably engaged. The tines can be separated by a slot, sheared, or partially sheared. Plungers with a slot can be non-rotatably attached to a spring having filars by captivating the filars in the respective plunger slots. Plungers with sheared tines can be non-rotatably attached to a spring using an interference fit.

Figure 52:
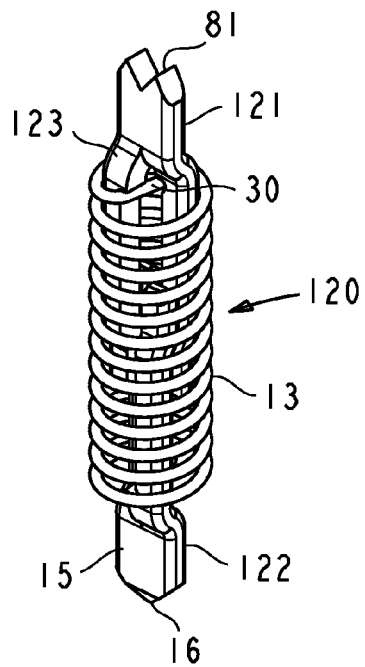
Figure 53:
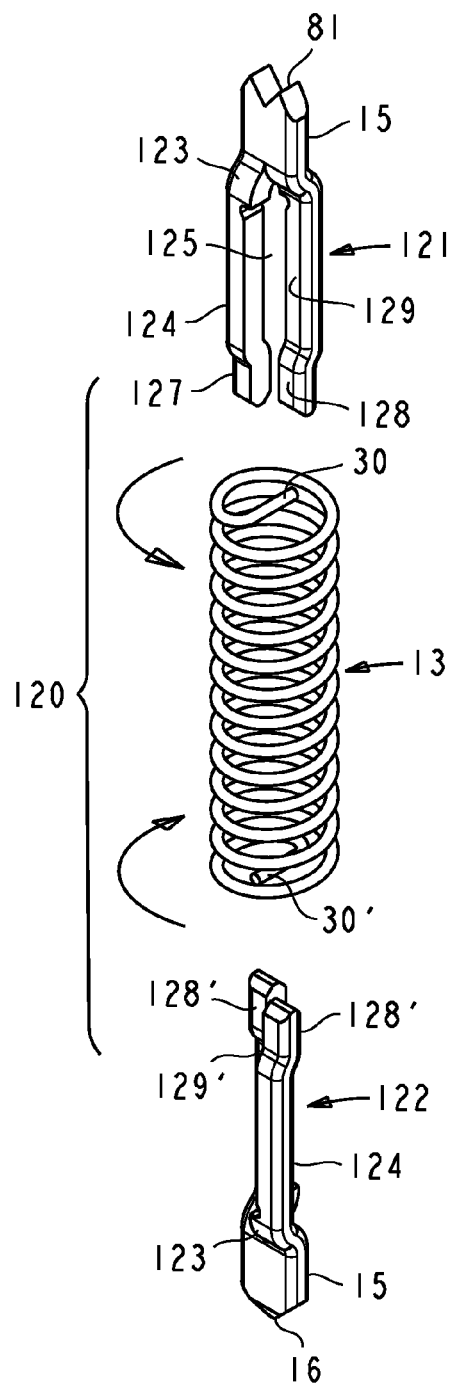
Figure 54:
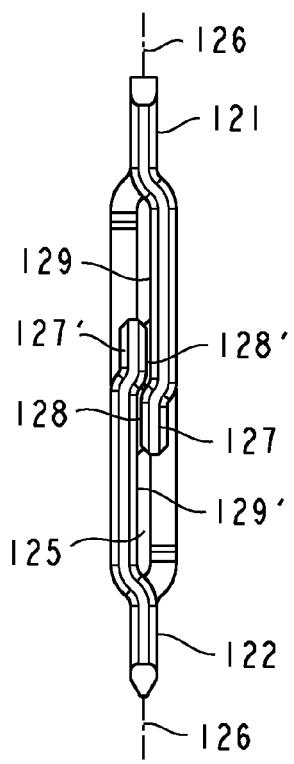
Figure 54:
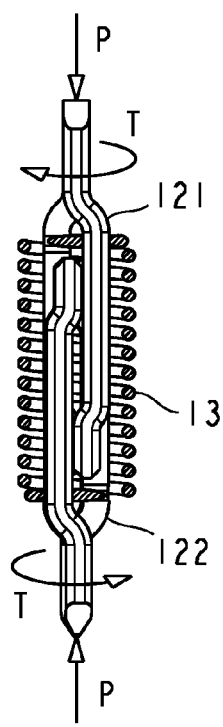

FIG. 52 shows a contact probe 120 which comprises a first plunger 121, a second plunger 122, and a coil spring 13. The components are better revealed in the exploded view of FIG. 53. The first plunger has a slotted contact tip 81, while the second plunger has a pointed contact tip 16. Shoulders 123 provide retention means for retaining the plungers in an insulator cavity. Each plunger has a coupling means comprising two diagonally disposed tines 124, separated by a slot 125. The slot enables respective filar 30 of the spring to be non-rotatably engaged to the plunger. The coupling means of each plunger has a mid-plane 126 and the tines are offset from the mid-plane in opposite directions. Each tine has a free end portion 127 formed toward the mid-plane. This creates stepped coupling surfaces; a raised inner side surface 128 on the free end portion of the tine and a recessed inner side surface 129 on the remaining portion of the tine, wherein the raised coupling surface is above the mid-plane and the recessed coupling surface is below the mid-plane. When the plungers are forcibly engaged passed the raised inner side surfaces, the raised inner side surfaces of one plunger are slidably coupled to the recessed inner side surfaces of the other plunger, as shown in FIG. 54A (with the spring omitted to reveal the plungers). The steps between the raised inner side surfaces and the recessed inner side surfaces provide latching detents for a retentive engagement between the plungers. A fully compressed probe with rotatably biased plungers is shown in FIG. 54B.

FIGS. 55-57 show a contact probe 130 which comprises plungers having diagonally disposed tines with stepped coupling surfaces. The plungers are axially biased by a spring having conventional coiled ends. The contact probe comprises a first plunger 131, a second plunger 131', and a coil spring 92. The components are better revealed in the exploded view of FIG. 56. Each plunger comprises a pointed contact tip 16 and outwardly formed retention shoulders 132. Each plunger further comprises two diagonally disposed tines 133, which are formed in the opposite directions. The tines have free end portions 127 separated by a slot 134, and are sheared along the remaining length. Each tine has a raised inner side surface 128 and a recessed inner side surface 129. Each tine further has a slotted inner edge 135 and a sheared inner edge 136. When the plungers are forcibly engaged passed the raised inner side surfaces, the raised inner side surfaces of one plunger are coupled to the recessed inner side surfaces of the other plunger, as shown in FIG. 57(with the spring omitted to fully reveal the plungers). In addition, the slotted edges 135 of one plunger are in opposition to the sheared edges 136 of the other plunger, which minimizes plunger tilt when the plungers are being further displaced.

FIGS. 58-61 show another embodiment of a contact probe having diagonally disposed tines and being biased by a spring having conventional coiled ends. Contact probe 140 comprises a first plunger 141, a second plunger 142, and a coil spring 92. The first plunger has a slotted contact tip 81, while the second plunger has a pointed contact tip 16. The components are better revealed in the exploded view of FIG. 59. Each plunger has shoulders 143 which support ends of the spring and facilitate retention of the contact probe in an insulator cavity. Adjoining the shoulders, each plunger further has a spring retaining portion 144 which is sized for an interference fit in end coils 93 of the spring. If a torsional bias is desired, the interference fit must be adequate to maintain non-rotatable attachment of the spring under the torsional bias and over a specified number of plunger displacement cycles. Each plunger comprises diagonally disposed tines 145, which are sheared and formed in opposite directions, creating inner side surfaces 146 and sheared inner edge surfaces 147. When the plungers are engaged, the inner side surfaces of one plunger are slidably and non-rotatably coupled to the inner edge surfaces of the other plunger as shown in FIG. 60A (with the spring omitted to fully reveal the plungers). When the torsional bias is applied, the inner side surfaces of the first plunger are rotatably biased against the inner edge surfaces of the other plunger as shown in FIG. 61. In the variation of FIG. 60B, two plungers 142 are slidably and non-rotatably coupled to each other. When a torsional bias is applied in this case, the inner side surfaces of one plunger are rotatably biased against the inner side surfaces of the other plunger.

FIGS. 62-67—Contact Probes with Plungers Having Orthogonal Coupling Surfaces The contact probes disclosed in this section have plungers with orthogonal coupling surfaces and cylindrical contact portions that are suitable for screw-machining FIGS. 62-64 show a contact probe 150 having a first plunger 151, a second plunger 152, and a coil spring 13. The first plunger comprises a 4-point crown contact tip 153 suitable for connecting to a BGA terminal, while the second plunger has a pointed contact tip 154 suitable for connecting to an LGA terminal. Each plunger has a retention shoulder 155, which facilitates retaining the probe in an insulator cavity. The coupling means comprises two tines 156, separated by a slot 157. Each tine comprises a paddle-shaped free end portion 158 and a fixed end portion 159. Each tine further comprises an inside surface 161 facing the slot and two outside surfaces 162 orthogonally adjoining the inside surface. The paddle-shaped free end portions provide extended inside surfaces 163 and form latching detents 164 which enable retentive self-latching of the plungers. The diametrical width of the plungers at fixed end portions 159 of the tines is sized to closely guide the end coils of the spring. The outside surface of each tine is tapered to allow the tines to deflect when the plungers are being forcibly engaged passed the detents. The filars of the spring are non-rotatably captivated in the slots of the respective plungers in a manner that prevents rotation of the spring's ends. When a torsional bias is applied, extended inside coupling surfaces 163 of one plunger are rotatably biased against outside coupling surfaces 169 of the other plunger, as shown in the cross-sectional view of FIG. 64.

FIGS. 65-67 show an embodiment of a contact probe having plungers with orthogonal coupling surfaces and adapted for a retentive engagement with the spring. A contact probe 170 comprises a first plunger 171, a second plunger 172, and a coil spring 13. The first plunger has a 4-point crown contact tip 153 while the second plunger has a pointed contact tip 154. Both plungers have a retention shoulder 155, which facilitates retaining the contact probe in an insulator cavity. The coupling means of each plunger comprises two tines, separated by a slot 173. The first plunger comprises tines 174, each tine having inside surface 175 and two outside surfaces 176, orthogonally adjoining the inside surface. The second plunger comprises two tines 177, each tine having inside surface 178, facing the slot. The filars of the spring are non-rotatably captivated in the slots of the respective plungers in a manner that prevents rotation of the spring's ends. The inside surfaces of the plungers have ledges 54, which enable retentive engagement of the filars to the respective plungers, as explained in connection with contact probe 50. When a torsional bias is applied, outside coupling surfaces 176 of the first plunger are rotatably biased against the inside coupling surfaces 178 of the second plunger, as shown in the cross-sectional view of FIG. 67.

FIGS. 68-77—Contact Probes Having a Single Coupling Tine

The contact probes disclosed in this section comprise plungers having a single tine. The single-tine plungers are not self-sustaining under torsional bias since they rely on a secondary contact with the spring to limit plunger rotation. However, the simplicity of the single-tine coupling configuration extends scalability of these contact probes to mounting centers well below 1.0 mm.

FIG. 68 is a side view of a contact probe 180, comprising a first plunger 181, a second plunger 182, and a coil spring 13. The components are better revealed in the exploded view of the contact probe in FIG. 69. The first plunger has a 4-point crown contact tip 153 while the second plunger has a pointed contact tip 154. Each plunger has a single coupling tine 183, a ledge 184, and a retention shoulder 165. The tine has a substantially flat coupling surface 185 with adjoining edges 186, and an outside surface 187. The cross-sectional profile of the tine is shown to be half-circular but this should not be viewed as limiting. The end filars 30 of the spring are non-rotatably captivated in the respective plunger slots, behind ledges 184. When a torsional bias is applied by the spring, the coupling surface of one plunger is rotatably biased against the coupling surface of the other plunger, as shown in the cross-sectional view of FIG. 70.

FIG. 71 and FIG. 72 are a side view and an exploded view respectively of a contact probe 190 comprising a first plunger 191, a second plunger 192, and a coil spring 92. Each plunger comprises a single coupling tine 193, a spring retaining portion 194, and a retention collar 195. Each plunger has a mid-plane 126 and each tine comprises a free end portion 196 and a stepped coupling surface; a raised coupling surface 197 on the free end portion of the tine and a recessed coupling surface 198 on the remaining portion of the tine. The raised coupling surface is above the mid-plane, while the recessed coupling surface is below the mid-plane. When the plungers are forcibly engaged passed the raised coupling surfaces, the raised coupling surface of one plunger is slidably coupled to the recessed coupling surface of the other plunger. The stepped coupling surface provides latching detent 199 which enables a retentive engagement between the plungers. The outside surface of each tine is tapered to enable tilting of the plunger when the plungers are being forcibly engaged passed the detents. The tines can be substantially rigid since no resilient deflection is required for latching. Each end of the spring has closely coiled end coils 93 which have an inside diameter sized to make an interference fit with spring retaining portion 194 of the respective plunger. This enables the spring ends to be non-rotatably attached to the plungers with a predetermined angle of twist, indicated by twist arrows in FIG. 72. When a rotational bias is applied, raised coupling surface 197 of at least one plunger is rotatably biased against recessed coupling surface 198 of the other plunger, thus generating a desired magnitude of contact force for a conductive coupling between the plungers. FIG. 73 show a contact probe 200, which is a variation of contact 190. Plungers 201 and 202 have flat coupling surfaces 185, as in contact probe 180.

FIGS. 74-77 show a contact probe 210 having stamped plungers which have a single coupling tine and are rotatably biased by a spring having end filars. The contact probe comprises a first plunger 211, a second plunger 212, and a coil spring 13. The first plunger has a slotted contact tip 81 while the second plunger has a pointed contact tip 16. Each plunger further has a coupling tine 213, a spring retaining portion 214, and a retention shoulder 215. The tine has a coupling surface 216 and adjoining edges 217. The spring retaining portion has a filar support surface 218. The spring retaining portion is non-rotatably captivated in a spring opening formed by the filar and the adjoining end coils of the spring, preferably with a light interference fit. This enables the spring to be assembled with a predetermined angle of twist which rotatably biases coupling surfaces 216 against each other to provide a direct conductive coupling between the plungers. The torsional bias can also be used to interlock the spring with the plungers.

Materials and Fabrication

One of the objects of the present invention is to provide cost effective high performance contact probes. This is accomplished by making most of the plungers producible by stamping, which is one of the most cost-efficient fabrication processes, and produces precisely dimensioned parts at high production rates and with good reproducibility. In addition, plungers for contact probes 10, 50, 100, 110, and 120 can be fabricated from a profiled stock. Plungers with cylindrical contact portions can be fabricated by screw machining Plungers for miniature contact probes will have an overall diametrical dimension of about 1.0 mm or less, but they can also be easily scaled up for use in considerably larger contact probes.

Many commonly used material and plating combinations used in electrical contact probes are applicable to the disclosed designs, including: tool steel, stainless steel, and beryllium copper for the plungers; music wire, stainless steel, and beryllium copper for the spring. Since the conductively coupled plungers provide the primary current path through the contact probe, they can be advantageously made from beryllium copper, which has a higher electrical conductivity than steel. Beryllium copper stock can be mill-hardened or, alternatively, the plungers can be heat treated after fabrication. Plungers are typically plated with about 1.0 μm minimum hard gold over 1-2 μm of electroless nickel. When hardness and durability are important, the plungers can be made from a tool steel, heat treated, and plated with rhodium, palladium-nickel, or other hard and wear resistant plating, preferably with a low coefficient of friction.

The spring is not a part of the primary current path, and ideally should be electrically insignificant. The spring's material can therefore be selected based on mechanical merits and ease of fabrication. The springs for the miniature probes, having an outside diameter of about 1.0 mm or less, will have best mechanical performance when made from music wire.

Beryllium copper can be used when non-magnetic properties are required. Stainless steel can be used when elevated temperature exposure is a consideration. Similarly, the plating of the spring can be primarily focused on the corrosion prevention rather than to assure a good electrical contact. A non-noble plating may be sufficient, or a noble plating can be used sparingly. Alternatively, the spring can be plated with electroless nickel with dispersed Teflon or coated with Parylene (available from Specialty Coating Systems, Indianapolis, Ind., USA), to protect the spring from corrosion, to electrically isolate the spring from the plungers, and to reduce the sliding friction between the spring and the spring guiding surfaces.

The insulative housing can be machined or molded from a polymeric material such as polyetheretherketone, polyamide-imide, polyimide, polyphenylene sulfide, polycarbonate, polyester, and alike, which can be reinforced, e.g., with glass fiber.

Advantages

The disclosed contact probes provide a combination of desirable features not realized in the known art. These include:

(1) Low inductance and low resistance; a torsional bias of the spring is used to establish a direct conductive connection through the plungers, without relying on the spring or a barrel for conductive path.
(2) The torsional bias of the spring provides a predictable contact force between the plungers, which can be controlled by varying the magnitude of the torsional bias. (The conventional contact probes depend on random effects, such as tilting of the plungers and buckling of the spring, for attaining a conductive coupling between the plungers and the barrel.)
(3) Redundant conductive coupling between the plungers; two lines of contact are established in parallel. (Conventional probes require two connections in series to complete the conductive path; from the first plunger to the barrel, and from the barrel to the second plunger.)
(4) High pointing accuracy; the torsional bias provides a clearance-free sliding engagement between the plungers along two lines of contact, which compels the plungers to remain coaxial. (In conventional probes, plungers make point contacts with the barrel, and there must be a plunger-to-barrel operating clearance to enable plunger tilt. The clearance is determined by the outside diameter of each plunger, the inside diameter of the barrel, and the respective plating thickness variation, and may have a large impact on contact pointing accuracy.)
(5) Direct conductive contact between the plungers makes the spring electrically insignificant; the spring material and plating can be selected based on mechanical merits, without regard to spring material conductivity.
(6) The spring can be coated with a thin layer of insulation to electrically isolate the spring from the plungers, to make the spring electrically insignificant, to protect the spring surfaces from corrosion, and/or to reduce friction between the spring and the spring guiding components.
(7) The external coupling surfaces are well defined and can have desired hardness, surface finish, and plating, to assure a predictable friction force and a wiping action. (In conventional probes, the contact and friction forces between plungers and the barrel can be erratic since the inside surface of the barrel is relatively soft and can be irregular and difficult to plate consistently.)
(8) The plungers can be economically fabricated from a strip by progressive die stamping or from a profiled stock by stamping or screw machining Both plungers can be fabricated from the same profiled stock, thus providing closely controlled hermaphroditic coupling features. (Conventional plungers are made from a round stock and are not amenable to fabrication by stamping.)
(9) Essential plunger features can be prefabricated in a profiled stock with a high degree of dimensional accuracy and reproducibility. A profiled stock can provide surface features, such as small edge rounds, that would be impractical to attain by machining alone.
(10) One piece handling; a three-piece contact probe can be handled as a unit; the plungers can be latched to each other or retentively attached to the spring using a torsional bias of the spring.
(11) Spring preload, enabled by latching plungers, reduces contact force variation.
(12) The disclosed contact probes can be used where twist-proof contacts are required. The plungers are non-rotatably engaged and the compression of the spring will not cause rotation of the plungers relative to the I/O terminals.
(13) Plungers with dual coupling tines provide a self-sustaining coupling under torsional bias. The self-sustaining coupling limits plunger tilt and maintains coaxiality of plungers.

While the contact probes and connectors have been described by means of specific embodiments, numerous modifications and variations known to those skilled in the art or disclosed may be employed without departing from the scope of the invention set forth in the claims. As to every element, it may be replaced by one of multiple equivalent alternatives, only some of which are disclosed in the specification. Thus the scope should be determined, not by the examples or specifics given, but by the appended claims and their legal equivalents.

I claim:

1. An electrical contact probe comprising a first plunger, a second plunger, and a coil spring;
    (a) the first plunger comprising a contact portion adapted for making a conductive connection to an input/output terminal of a first device; and a coupling means adapted to slidably and non-rotatably engage the second plunger; the coupling means having a lengthwise slot and two adjoining tines, each tine having a free end and a predetermined length, and comprising canted surfaces extending along the length of the tine;
    (b) the second plunger comprising a contact portion adapted for making a conductive connection to an input/output terminal of a second device; and a coupling means adapted to slidably and non-rotatably engage the first plunger; the coupling means having a lengthwise slot and two adjoining tines, each tine having a free end and a predetermined length, and comprising canted surfaces extending along the length of the tine;
    (c) a coil spring having a central axis, a first end, and a second end; the first end being engaged to the first plunger, and the second end being engaged to the second plunger;
    wherein the plungers are slidably and non-rotatably coupled to each other and the spring is captivated between the plungers, whereby when the contact probe is compressed between the first device and the second device, the spring provides an axial bias for a conductive connection of the plungers to the respective input/output terminals of the first and the second device.

2. The contact probe of claim 1, wherein the free ends of the tines have latching detents projecting into the slot, the detents of the first plunger cooperating with the detents of the second plunger to retentively latch the plungers to each other.

3. The contact probe of claim 1, wherein the canted surfaces are stepped to form narrowly-spaced canted surfaces adjoining the free end of the tine, and widely-spaced canted surfaces along the remaining portion of the tine, wherein after the plungers are forcibly engaged passed the narrow canted surfaces, the narrow canted surfaces of one plunger are slidably and non-rotatably coupled to the widely-spaced canted surfaces of the other plunger, and wherein the steps from the narrowly-spaced canted surfaces to the widely-spaced canted surfaces form latching detents, which enable the plungers to be retentively engaged to each other.

4. The contact probe of claim 1 wherein the first and the second end of the spring each has a filar formed radially toward the central axis of the spring, each filar being non-rotatably engaged with the slot in the respective plunger.

5. The contact probe of claim 4 wherein the slot in each plunger has a closed end and each tine comprises ledges adjoining the closed end of the slot, wherein a torsional action of the spring is used to rotate the filar behind the ledges, thus retentively attaching each end of the spring to the respective plunger.

6. The contact probe of claim 4, wherein the coil spring is a compression spring and the slot has a closed end having a coincident edge, wherein the edge bears on the respective spring filar when the spring is axially compressed.

7. The contact probe of claim 4, wherein the coil spring is an extension spring and wherein the free ends of the tines comprise hooks adapted to retentively captivate the respective filar of the spring by rotating the filar into the hooks using a torsional action of the spring; and wherein the free ends of the tines further comprise bearing surfaces which support the respective filar of the spring when the spring is axially extended.

8. The contact probe of claim 1 wherein the first and the second end of the spring each has end coils, and each plunger has a spring retaining portion, wherein the spring retaining portion is sized for an interference fit with the end coils, whereby when the spring retaining portions are pressed into the respective end coils, the ends of the spring are non-rotatably attached to the respective plungers by the interference fit.

9. The contact probe of claim 1, wherein the spring ends are non-rotatably engaged to the respective plungers and wherein the spring is attached to the plungers with a predetermined angle of twist, wherein the predetermined angle of twist is permanently retained by the plungers and provides a torsional bias for a direct conductive coupling between the plungers.

10. The contact probe of claim 9, wherein the spring is a compression spring and the predetermined angle of twist is in the spring winding direction.

11. The contact probe of claim 9, wherein the spring is an extension spring and the predetermined angle of twist is in the spring unwinding direction.

12. The contact probe of claim 1, wherein each tine further comprises round edges adjoining the canted surfaces, and a substantially round outside surface; wherein the canted surfaces, the round edges, and the outside surface are substantially pre-fabricated in a profiled stock from which the plunger is subsequently made by one or more processes selected from the group consisting of stamping, screw machining, machining, abrasive machining, and electromachining.

13. The contact probe of claim 1 wherein the plungers are fabricated by forming a profiled stock into a U-shaped configuration, wherein the sides of the U provide the tines and the bottom of the U provides a rounded contact portion.

14. The contact probe of claim 1, wherein in an unbiased state, the canted surfaces of the first plunger are separated from the canted surfaces of the second plunger by a small clearance so that the plungers can be slidably and non-rotatably coupled without interference, and wherein when a torsional bias is applied to the plungers, the canted surfaces that are rotatably biased toward each other are brought to a conductive contact.

15. The contact probe of claim 1, wherein the coil spring has an insulating coating, wherein the coating insulates the spring from the plungers.

16. The contact probe of claim 1, wherein a portion of the spring has closely wound coils employed to reduce a torsional stiffness of the spring.

17. The contact probe of claim 1 wherein the contact portion of the second plunger comprises an elongated tail suitable for mounting in a plated-through hole of a printed circuit board or for plugging into a socket.

18. An electrical contact probe comprising a first plunger, a second plunger, and a coil spring;
  (a) the first plunger comprising a substantially flat contact portion adapted for making a conductive connection to an input/output terminal of the first device; and a coupling means adapted to slidably and non-rotatably engage the second plunger; the coupling means having a mid-plane and comprising two diagonally disposed tines offset from the mid-plane in opposite directions; each tine having an inner side surface;
  (b) the second plunger comprising a substantially flat contact portion adapted for making a conductive connection to an input/output terminal of the second device; and a coupling means adapted to slidably and non-rotatably engage the first plunger; the coupling means having a mid-plane and comprising two diagonally disposed tines offset from the mid-plane in opposite directions; each tine having an inner side surface;
  (c) a coil spring having a central axis, a first end, and a second end; the first end being engaged to the first plunger, and the second end being engaged to the second plunger;
  wherein the plungers are slidably and non-rotatably coupled to each other, and the spring is captivated between the plungers; whereby when the contact probe is compressed between the first device and the second device, the spring provides an axial bias for a conductive connection of the plungers to the respective input/output terminals of the first and the second device.

19. The contact probe of claim 18, wherein the inner side surfaces of each tine are substantially coincident with the mid-plane, and wherein the inner side surfaces of one plunger are slidably coupled to the inner side surfaces of the other plunger.

20. The contact probe of claim 18, wherein each tine has a stepped free end portion formed toward the mid-plane, and each tine further has a raised inner side surface on the stepped free end portion of the tine, and a recessed inner side surface on the remaining portion of the tine, wherein the raised coupling surface is above the mid-plane and the recessed coupling surface is below the mid-plane; whereby when the plungers are forcibly engaged passed the raised inner side surfaces, the raised side surfaces of one plunger are slidably coupled to the recessed side surfaces of the other plunger; and wherein the stepped free end portions of the tines provide latching detents for a retentive engagement between the plungers.

21. The contact probe of claim 18 wherein the first and the second end of the spring each has a filar formed radially toward the central axis of the spring, and the coupling means of each plunger has a centrally disposed slot; wherein each filar is non-rotatably engaged with the slot of the respective plunger.

22. The contact probe of claim 18, wherein the spring ends are non-rotatably attached to the respective plungers, and the spring is attached to the plungers with a predetermined angle of twist, wherein the predetermined angle of twist is permanently retained by the plungers and provides a torsional bias for a direct conductive coupling between the plungers.

23. The contact probe of claim 18, wherein each tine further comprises an inner edge, wherein the inner side surfaces of one plunger are coupled to the inner edge surfaces of the other plunger.

24. An electrical contact probe comprising a first plunger, a second plunger, and a coil spring;
(a) the first plunger comprising a contact portion adapted for making a conductive connection to an input/output terminal of the first device; and a coupling means adapted to slidably and non-rotatably engage the second plunger; the coupling means comprising a lengthwise slot and two adjoining tines, each tine having an inside surface facing the slot and two outside surfaces orthogonally adjoining the inside surface;
(b) the second plunger comprising a contact portion adapted for making a conductive connection to an input/output terminal of the second device; and a coupling means adapted to slidably and non-rotatably engage the first plunger; the coupling means comprising a lengthwise slot and two adjoining tines, each tine having an inside surface facing the slot;
(c) a compression coil spring having a first end adapted to non-rotatably engage the first plunger, and a second end adapted to non-rotatably engage the second plunger; the spring being attached to the plungers with a predetermined angle of twist between the first end and the second end;
wherein the plungers are slidably and non-rotatably coupled to each other, and wherein the predetermined angle of twist is permanently retained between the plungers and provides a torsional bias; wherein the torsional bias of the spring rotatably biases the inside surfaces of the second plunger against the outside surfaces of the first plunger, thus establishing a direct conductive connection between the plungers; and wherein when the contact probe is compressed between the first device and the second device, the spring further provides an axial bias for a conductive connection of the plungers to the respective input/output terminals of the first and the second device.

25. The contact probe of claim 24 wherein the first and the second end of the spring each has a filar formed radially toward the central axis of the spring; and wherein each plunger comprises ledges, wherein a torsional action of the spring is used to rotate the filar behind the ledges, thus retentively attaching each filar to the respective plunger.

26. The contact probe of claim 24 wherein each tine of the second plunger further comprises outside surfaces orthogonally adjoining the tine's inside surface and wherein the tines of each plunger have paddle-shaped end portions and adjoining detents; the detents projecting sidewise and providing extended inside surfaces, wherein the detents are used to retentively attach the plungers to each other; and wherein the torsional bias of the spring rotatably biases the extended inside surfaces of one plunger against the outside surfaces of the other plunger, thus establishing a direct conductive connection between the plungers.

27. An electrical contact probe comprising a first plunger, a second plunger, and a coil spring;
(a) the first plunger comprising a contact portion adapted for making a conductive connection to an input/output terminal of a first device; a spring-retaining portion adapted to non-rotatably engage the spring; and a coupling tine adapted to slidably engage the second plunger;
(b) the second plunger comprising a contact portion adapted for making a conductive connection to an input/output terminal of the second device; a spring-retaining portion adapted to non-rotatably engage the spring; and a coupling tine adapted to slidably engage the first plunger; and
(c) a compression coil spring having a first end adapted to non-rotatably engage the first plunger, and a second end adapted to non-rotatably engage the second plunger; the spring being attached to the plungers with a predetermined angle of twist between the first end and the second end, wherein the predetermined angle of twist is permanently retained between the plungers and provides a torsional bias for a direct conductive coupling between the plungers;
wherein the plungers are slidably and non-rotatably coupled to each other, and wherein when the contact probe is compressed between the first device and the second device, the spring further provides an axial bias for a conductive connection of the plungers to the respective input/output terminals of the first and the second device.

28. The contact probe of claim 27 wherein the spring has a central axis, and the first and the second end of the spring each has a filar formed radially toward the central axis, and wherein the spring retaining portion of each plunger further comprises a bearing surface, wherein the bearing surface supports the respective filar of the spring when the contact probe is axially compressed.

29. The contact probe of claim 28 wherein the spring-retaining portion of the plunger comprises a ledge, wherein a torsional action of the spring is used to rotate the filar behind the ledge, thus retentively attaching each end of the spring to the respective plunger.

30. The contact probe of claim 28 wherein at least one plunger has a substantially rectangular cross-sectional profile, wherein the cross-sectional profile is sized for an interference fit in an opening in the respective end of the coil spring, the opening being formed by the filar and an adjoining spring coil; whereby the interference fit provides the non-rotatable engagement of the plunger to the spring.

31. The contact probe of claim 27 wherein the first and the second end of the spring each has end coils having a predetermined inside diameter sized for an interference fit with the spring retaining portion of the plunger, wherein the interference fit provides the non-rotatable attachment of the spring to the plungers.

32. The contact probe of claim 27 wherein each plunger has a mid-plane and each tine has a free end portion, and wherein each tine has a stepped coupling surface comprising a raised coupling surface on the free end portion of the tine and a recessed coupling surface on the remaining portion of the tine, wherein the raised coupling surface is above the mid-plane while the recessed coupling surface is below the mid-plane; whereby when the plungers are forcibly engaged passed the raised coupling surfaces, the raised coupling surface of one plunger is slidably coupled to the recessed coupling surface of the other plunger; and whereby the steps between the coupling surfaces provide detents for a retentive engagement between the plungers.

33. The contact probe of claim 27, wherein the outside surface of the tine is tapered to enable tilting of the plunger when the plungers are being forcibly engaged at the detents.

34. The contact probe of claim 27, wherein the contact portion of at least one plunger is substantially cylindrical.

35. An electrical connector for connecting a first electrical device having a first array of input/output terminals to a second electrical device having a second array of input/output terminals; the second array being opposite and complementary to the first array; the connector comprising:
  (a) a dielectric housing having a plurality of cavities, the cavities arranged in an array complementary to the arrays of the first and second arrays of the input/output terminals; each cavity adapted to accommodate a contact probe;
  (b) a plurality of contact probes, each contact probe received in a respective cavity of the dielectric housing; each contact probe comprising:
  a first plunger comprising a contact portion adapted for making a separable conductive connection to an input/output terminal of the first device; and a coupling means adapted to slidably and non-rotatably engage the second plunger;
  a second plunger comprising a contact portion adapted for making a conductive connection to an input/output terminal of the second device; and a coupling means adapted to non-rotatably engage the first plunger;
  a coil spring having a first end adapted to non-rotatably engage the first plunger, and a second end adapted to non-rotatably engage the second plunger;
  wherein the coupling means of the first plunger is slidably and non-rotatably coupled to the coupling means of the second plunger; and wherein the spring is attached to the plungers with a predetermined angle of twist and provides a torsional bias for a direct conductive coupling between the plungers; and, when the probe is compressed between the first device and the second device, the spring further provides an axial bias for a direct conductive connection between the respective input/output terminals of the first device and the second device.

36. The connector of claim 35 wherein at least one contact probe has coupling means comprising a lengthwise slot and two adjoining tines and wherein the spring has a central axis, and the first and the second end of the spring each has a filar formed radially toward the central axis of the spring, each filar being non-rotatably engaged with the slot in the respective plunger.

* * * * *